US010788536B2

(12) United States Patent
Zhang et al.

(10) Patent No.: US 10,788,536 B2
(45) Date of Patent: Sep. 29, 2020

(54) SYSTEM AND APPARATUS FOR BATTERY INTERNAL SHORT CURRENT DETECTION UNDER ARBITRARY LOAD CONDITIONS

(71) Applicant: Texas Instruments Incorporated, Dallas, TX (US)

(72) Inventors: Yandong Zhang, Plano, TX (US); Yevgen Barsukov, Richardson, TX (US); Brian Paul Alongi, Dallas, TX (US); Kang Kang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 319 days.

(21) Appl. No.: 15/843,406

(22) Filed: Dec. 15, 2017

(65) Prior Publication Data
US 2018/0328998 A1  Nov. 15, 2018

Related U.S. Application Data

(60) Provisional application No. 62/504,743, filed on May 11, 2017.

(51) Int. Cl.
*G01R 31/36* (2020.01)
*G01R 31/367* (2019.01)
*G01R 31/388* (2019.01)
*G01R 31/392* (2019.01)
*G01R 31/3842* (2019.01)
*H01M 10/42* (2006.01)

(52) U.S. Cl.
CPC ......... *G01R 31/367* (2019.01); *G01R 31/388* (2019.01); *G01R 31/3842* (2019.01); *G01R 31/392* (2019.01); *H01M 10/42* (2013.01)

(58) Field of Classification Search
CPC .................................... G01R 31/367; G01R 31/3842; G01R 31/392; G01R 31/388; H01M 10/42
See application file for complete search history.

(56) References Cited

U.S. PATENT DOCUMENTS

| 6,789,026 | B2 | 9/2004 | Barsoukov et al. |
| 6,832,171 | B2 | 12/2004 | Barsoukov et al. |
| 6,892,148 | B2 | 5/2005 | Barsoukov et al. |
| 7,248,053 | B2 | 7/2007 | Houldsworth |

(Continued)

OTHER PUBLICATIONS

Yevgen Barsukov, :Battery Cell Balancing: What to Balance and How, Texas Instruments Inc., presented in Portable Power Design Seminar, Boston, May 9, 2006, pp. 2-1 through 2-8.

(Continued)

*Primary Examiner* — Mohammad K Islam
(74) *Attorney, Agent, or Firm* — Lawrence J. Bassuk; Charles A. Brill; Frank D. Cimino

(57) ABSTRACT

Disclosed examples include systems and methods for determining an internal short condition in a battery. The method includes computing an estimated current value based on a measured battery voltage, a measured battery current, a measured battery temperature, and a model of the battery that includes steady state characteristics of the battery and transient characteristics of the battery. The method further includes computing an internal short current value according to the measured battery current and the estimated current value, and determining if a battery short condition exists according to the internal short current value.

22 Claims, 9 Drawing Sheets

(56) References Cited

U.S. PATENT DOCUMENTS

| | | |
|---|---|---|
| 7,259,572 B2 | 8/2007 | Houldsworth et al. |
| 7,315,489 B2 | 1/2008 | Houldsworth |
| 7,443,140 B2 | 10/2008 | Barsukov et al. |
| 7,808,244 B2 | 10/2010 | Barsukov et al. |
| 7,856,328 B2 | 12/2010 | Barsoukov et al. |
| 8,049,465 B2 | 11/2011 | Barsoukov et al. |
| 8,421,416 B2 | 4/2013 | Hsu et al. |
| 8,450,978 B2 | 5/2013 | Barsukov et al. |
| 8,749,204 B2 * | 6/2014 | Majima ............... G01R 31/36 320/149 |
| 9,130,377 B2 | 9/2015 | Barsukov et al. |
| 9,201,121 B2 | 12/2015 | Barsukov et al. |
| 9,236,748 B2 | 1/2016 | Barsukov et al. |
| 10,295,606 B2 * | 5/2019 | McCoy ............... G01R 31/50 |
| 10,365,312 B2 * | 7/2019 | Friedrich ............ G01R 31/52 |
| 2005/0253591 A1 * | 11/2005 | Kasamatsu ......... G01R 31/392 324/432 |
| 2007/0029970 A1 | 2/2007 | Barsukov et al. |
| 2009/0099799 A1 | 4/2009 | Barsoukov et al. |
| 2009/0099802 A1 | 4/2009 | Barsoukov et al. |
| 2009/0246612 A1 * | 10/2009 | Naoi ..................... H01M 2/162 429/144 |
| 2009/0248331 A1 | 10/2009 | Barsukov |
| 2009/0261786 A1 | 10/2009 | Hsu et al. |
| 2009/0295397 A1 | 12/2009 | Barsukov |
| 2010/0201321 A1 * | 8/2010 | Asakura .............. B60L 3/0069 320/132 |
| 2010/0289457 A1 | 11/2010 | Onnerud et al. |
| 2011/0031944 A1 | 2/2011 | Stirk et al. |
| 2011/0060538 A1 * | 3/2011 | Fahimi ............... G01R 31/392 702/63 |
| 2011/0089901 A1 | 4/2011 | White et al. |
| 2011/0148426 A1 * | 6/2011 | Yokotani ......... G01R 19/16542 324/434 |
| 2011/0260687 A1 | 10/2011 | Kudo et al. |
| 2012/0049802 A1 | 3/2012 | Barsukov et al. |
| 2012/0074898 A1 | 3/2012 | Schwartz |
| 2012/0091963 A1 | 5/2012 | Vance et al. |
| 2012/0143585 A1 * | 6/2012 | Barsukov ............ G01R 31/367 703/18 |
| 2012/0194133 A1 | 8/2012 | Posamentier et al. |
| 2013/0179012 A1 * | 7/2013 | Hermann ............. B60L 58/22 701/22 |
| 2014/0077752 A1 | 3/2014 | Barsukov et al. |
| 2015/0028774 A1 * | 1/2015 | Konishi ............... H05B 45/50 315/302 |
| 2016/0018345 A1 * | 1/2016 | Park .................... G01R 31/367 702/63 |
| 2016/0124051 A1 * | 5/2016 | Prasad ................ G01R 31/367 324/426 |
| 2018/0062401 A1 * | 3/2018 | Quiambao ........... G01R 31/389 |
| 2018/0074131 A1 * | 3/2018 | Lim ...................... H01M 10/48 |
| 2019/0128929 A1 * | 5/2019 | Hashimoto .......... G01R 19/165 |
| 2019/0219640 A1 * | 7/2019 | Liu ....................... G01R 31/52 |

OTHER PUBLICATIONS

"2-Series, 3-Series, and 4-Series Li-Ion Battery Pack Manager" Texas Instruments, SLUSA91A, Oct. 2010, Revised Jan. 2012, 23 pages.

* cited by examiner

SYSTEM AND APPARATUS FOR BATTERY INTERNAL SHORT CURRENT DETECTION UNDER ARBITRARY LOAD CONDITIONS

REFERENCE TO RELATED APPLICATION

Under 35 U.S.C. § 119, this application claims priority to, and the benefit of, U.S. provisional patent application No. 62/504,743, entitled "SYSTEM AND APPARATUS FOR BATTERY INTERNAL SHORT CURRENT DETECTION UNDER ARBITRARY LOAD CONDITIONS", and filed on May 11, 2017, the entirety of which is hereby incorporated by reference.

BACKGROUND

An internal short current in a battery can cause many problems including a catastrophic battery failure. Particularly, during operation, chemical degradation may result in the separation of small metallic particles inside of a battery. This sometimes causes the internal short circuits that causes a battery to stop functioning properly.

To protect against this, some electronic devices employ an external protection circuit to detect increasing battery temperature or overheating. When an overheating event is detected, the battery is disconnected from the circuit to which it is connected. This approach offers some ability to limit damage to an external circuit due to undesirable battery behavior; however, the overheating is sometimes a sign of an irreversible process regardless of any disconnecting of the battery from surrounding circuitry. Therefore, while this approach offers some level of protection, the possibility of overheating still remains.

Accordingly, for at least the aforementioned reasons, there exists a need in the art for advanced systems, circuits and methods for determining potential battery failure.

SUMMARY

Systems and methods are described for determining an internal short condition in a battery. One example method includes computing an estimated current value based on a measured battery voltage, a measured battery current, a measured battery temperature, and a model of the battery that includes steady state characteristics of the battery and transient characteristics of the battery. In one example, the method further includes computing an internal short current value according to the measured battery current, and the estimated current value, and determining if a battery short condition exists according to the internal short current value.

In some examples, the method further includes computing a depth of discharge (DOD) of the battery according to the measured battery voltage, the measured battery current, the measured battery temperature, and the model. In some examples, the method further includes computing the estimated current value for each of a plurality of different sample times and computing the internal short current value for each of the sample times. In some examples, the method further includes computing a first linear regression according to an integer number J of the internal short current values to determine a first regression average value and a first regression deviation value, where J is greater than 1. In some examples, the method further includes computing a second linear regression according to a second integer number K of the internal short current values to determine a second regression average value and a second regression deviation value, where K is greater than J. In some examples, the method further includes computing a first upper error margin value and a first lower error margin value according to the first regression deviation value. In some examples, the method further includes computing a second upper error margin value and a second lower error margin value according to the second regression deviation value. In some examples, the method further includes determining a short condition status value according to the first upper error margin value, the first lower error margin value, the second upper error margin value and the second lower error margin value.

In some implementations, the method further includes computing the first upper error margin value and the second upper error margin value according to a variance error, and a gain error. In some examples, the method further includes computing the first lower error margin value and the second lower error margin value according to the variance error, and the gain error. In some examples, the method further includes computing the first upper error margin value and the second upper error margin value according to an offset error; and computing the first lower error margin value and the second lower error margin value according to the offset error. In some examples, the method further includes computing the first upper error margin value and the second upper error margin value according to a first transient error; and computing the first lower error margin value and the second lower error margin value according to a second transient error.

In some examples, the method further includes in response to either the first upper error margin value or the second upper error margin value being less than a first threshold, incrementing a low fault counter; and in response to the low fault counter being greater than a first predetermined number, setting the short condition status value to a first value which indicates that no battery short condition exists. In some examples, the method further includes in response to either the second lower error margin value or the first lower error margin value being greater than the first threshold, setting the low fault counter equal to zero.

In some examples, the method further includes: in response to either the first upper error margin value being less than a second threshold or the first upper error margin value being less than the first threshold, incrementing a high fault counter; and in response to the high fault counter being greater than a second predetermined number, setting the short condition status value to a second value which indicates that a battery short condition exists.

In some examples, the method further includes in response to the either the second lower error margin value or the first lower error margin value being lower than the second threshold, setting the high fault counter equal to zero.

In some examples, the method further includes in response to determining that the battery short condition exists, disconnecting the battery. In some examples, the method further includes in response to determining that the battery short condition exists, delivering an instruction to output an audio or visual alarm.

DETAILED DESCRIPTION

Figure 1:
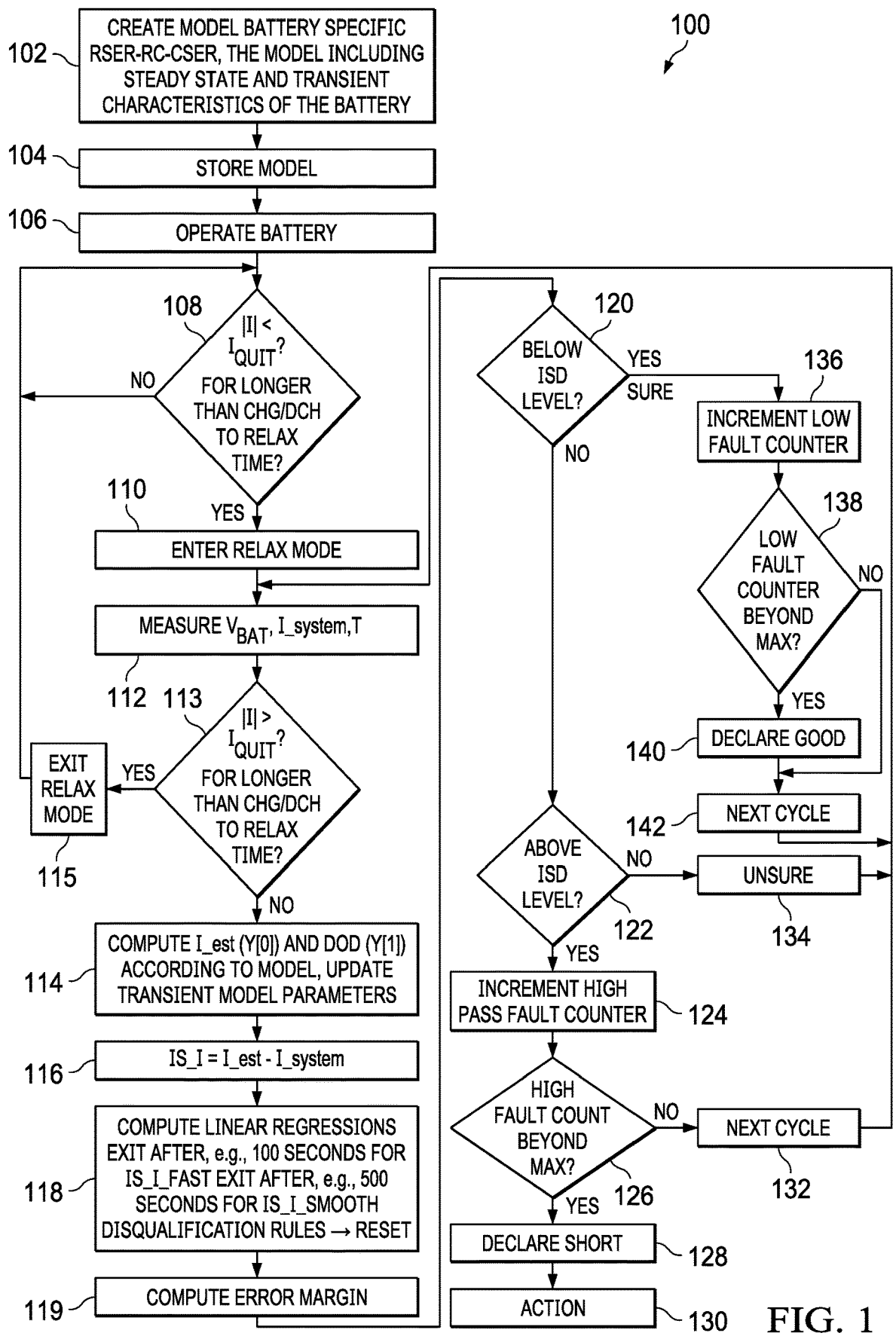
FIG. 1 is a flow diagram of a method of determining an internal short condition in a battery.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical or mechanical connection or combinations thereof. For example, if a first device couples to or is coupled with a second device, that connection, in one implementation, is through a direct electrical connection, or through an indirect electrical connection via one or more intervening devices and connections.

The systems and methods described herein relate to detecting the existence of the internal short current and estimating its value. In one implementation, an internal short detection (ISD) model is built for a specific type of battery in a laboratory. The ISD model includes model parameters, which are then loaded into a memory, such as a flash, of a battery control or monitoring circuit. During run time, an internal short current is estimated based on the voltage across the battery, measured current and temperature. In one implementation of the ISD model, due to the strong nonlinearity of batteries dynamics, the model uses a set of switching linear differential equations to approximate the correlation between voltage, measured current and the ISD. Given: (i) the finite history of the voltage/current/temperature; and (ii) the contemporary voltage/measured current/temperature information, the contemporary ISD is estimated accurately based on the model. The presently disclosed examples facilitate short current monitoring under variable load conditions. This variable load approach is advantageous over solutions that are based on constant or no system current conditions, because the accuracy of an ISD model can be strongly affected by load variations such that any additional noise may result in unacceptable accuracy. The systems and methods described herein model battery response to current variations and are able to determine ISD within a wide range of current variations. The systems and methods described herein are inexpensive and easy to use, due to the absence of any additional measurement capability requirements. Internal short detection can help to prevent system problems due to low resistance internal short by early detection of a high-resistance short that can evolve to lower resistance over time. In one example, cell phone applications require detection of a high internal short condition even during standby, when highly variable spike loads caused by periodic tasks are present, such as WiFi and GSM pulses up to 2A. Simply rejecting the spikes as outliers is not sufficient to support this detection, since the spikes constitute most of the load.

The present disclosure provides solutions that extend the battery model from a single Rser-Cser circuit mode, to the Rser-RC-Cser level, where Rser is the serial resistance, and Cser is the serial capacitance of the modeled battery. Adding one RC element facilitates improved modeling of the full dynamic voltage profile during current spikes and use of the model in current estimation. Some examples include two or more RC elements. An increase of the number of RC elements is particularly useful if the available sampling rate of voltage and current is higher than time constant of the presently used RC circuit. In some examples, an additional RC circuit with smaller time constant is added. Using higher sampling rate and a higher number of RC time constants increases accuracy if the duration of the load variations that occur in the system is on the same order of magnitude as the increased sampling rate. In certain examples, the measured current is subtracted from the estimated current for each sample to determine an internal short current (referred to herein as IS current). This allows changing spikes from noise to useable data for short monitoring and detection, and reduces noise level in IS by several orders of magnitude. In certain examples described below, the resulting IS current values are subjected to linear regression analysis for smoothing and determining error margins.

FIG. 1 illustrates a method 100 of determining an internal short condition in a battery. Certain portions of the method 100 can be implemented by a processor or other circuitry of a battery monitoring or controller circuit, for example, as illustrated and described below in connection with FIG. 2. The example of FIG. 1 includes creating a model of the battery specific Rser-RC-Cser at 102. The model includes steady state and transient characteristics of the battery. At 104, the method 100 further includes storing the model in memory. The method 100 includes operating the battery at 106. During the operation of the battery, the method 100 continues at 108 with determining if the system is operating in a relaxed mode, referred to herein as "relax mode". In the illustrated example, internal short conditions are monitored in the relax mode. In other implementations, the described methods and systems can be used to monitor short conditions in other operating modes of a battery powered system. In the illustrated example, the method includes determining at 108 whether the absolute value of the current "I" (e.g., I_system of FIG. 2) is less than a threshold value $I_{QUIT}$ (e.g., whether $|I|<I_{QUIT}$) for longer than a predetermined charging or discharging (chg/dch) relax time amount). In one example, the current "I" evaluated at 108 and 113 below is a measured system current I_system. If the absolute value of the evaluated current is not below the threshold value $I_{QUIT}$ (NO at 108), the method returns to 108. If so (YES at 108), the method proceeds to enter the relax mode at 110. At 112, the method 100 further includes measuring a battery voltage (e.g. $V_{BAT}$ of FIG. 2), a system current (I_system), and a battery temperature (T). At 113, a determination is made at whether |I| is greater than $I_{QUIT}$ for longer than the chg/dch to relax time. If so (YES at 113), the method 100 exits the relax mode at 115 and returns to 108 as described above. If not (NO at 113), the method 100 proceeds to compute an estimated current value (I_est, referred to herein as "Y[0]") and a depth of discharge (DOD) value referred to herein as "Y[1]" at 114 according to the model. The method at 114 also includes updating the transient model parameters, which will be discussed in further detail particularly with respect to FIG. 5.

At 116, the method further includes computing the internal short current IS_I as the difference between the estimated current and the system current (e.g., IS_I=I_est−I_system). At 118, the method 100 further includes computing linear regressions of the internal short current. In the illustrated example, two linear regressions are computed over different time durations, and the shorter duration linear regression computes values referred to herein as "fast". The longer duration linear regression computes values referred to herein as "smooth". For example, the fast (e.g., shorter duration) linear regression computations are discontinued after, e.g., 100 sec for IS_I_FAST, and the smooth (e.g., longer duration) linear regression computations are discontinued after, e.g., 500 sec for IS_I_SMOOTH. In the illustrated example, the processing at 118 further includes applying disqualification rules.

The method 100 further includes computing one or more error margins at 119. The method 100 further includes determining at 120 whether one or more of the computed error margins is/are below an internal short detection (ISD) threshold level. If so (YES at 120) the method proceeds to increment a low fault counter at 136, and a determination is made at 138 as to whether the low fault counter is beyond a predetermined maximum value. If so (YES at 138), the method 100 includes determining that the battery is good (e.g. that no internal short condition exists) at 140, and the method proceeds to the next cycle at 142. If the low fault counter is not beyond the maximum value (NO at 138), the method proceeds to the next cycle at 142 without declaring the battery good and returns to 112 as described above.

If none of the computed error margins is/are below the internal short detection (ISD) level (NO at 120), the method 100 continues at 122, including determining whether the computed error margins is/are above the internal short detection ISD level. If so (YES at 122), a high pass fault counter is incremented at 124, and a determination is made at 126 as to whether the high fault counter is beyond a predetermined maximum which is set according to a desired level of confidence. If so (YES at 126), the method includes declaring or otherwise determining that there is a short current fault at 128, and one or more remedial actions are taken at 130 (e.g. disconnecting the battery, or other remedial action). If the high fault count value is not beyond the maximum (NO at 126), the method 100 advances to the next monitoring cycle at 132, and returns to 112. In addition, if the computed error margin or margins is/are not above the internal short detection ISD level (NO at 126), method 100 includes determining an uncertain or unsure condition at 134, and the process returns to 112.

Prior systems for determining a battery short condition did not use a model to compute an estimated current value (I_est) (e.g., step 114 of FIG. 1), and then compute an internal short current according to the estimated current value (I_est) and measured battery current (I_system) (e.g., step 116 of FIG. 1).

Figure 2:
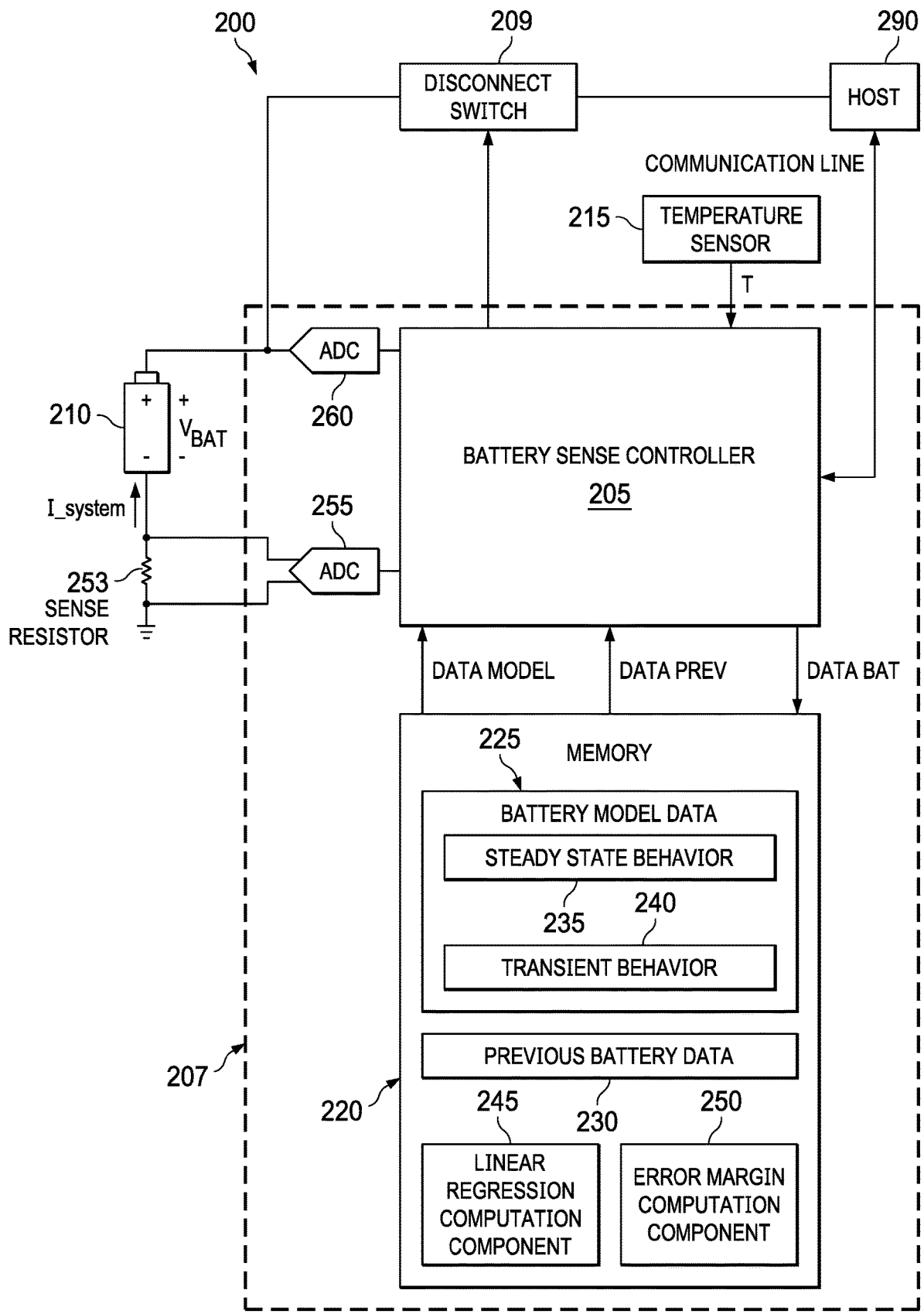
FIG. 2 illustrates a system for determining an internal short condition in a battery.

FIG. 2 illustrates a system 200 for determining an internal short condition in a battery 210. The system 200, in one example, is in communication with a host circuit 290, such as a portable electronic device having a battery system controller. In another example, the system 200 can be a part of the host circuit 290. In one example, the host circuit 290 is a laptop. In another example, the host circuit 290 is a cell phone or any other portable electronic device.

The system 200 includes a battery sense controller 205 that is configured to determine a state of charge (SOC) of a battery 210 during operation of the associated portable electronic device. In one implementation, the SOC is sent from the battery sense controller 205 to the host 290 in a communication line. In one implementation, the battery sense controller 205 is configured to continuously sample a voltage $V_{BAT}$ of the battery 210 at each of a plurality of sampling periods to provide the SOC of the battery 210 at each of the sampling periods based on the voltage $V_{BAT}$ a temperature of the battery 210, predetermined data associated with steady-state and transient behaviors of the battery 210 relative to a depth of discharge (DOD) of the battery 210. In the example of FIG. 2, the battery 210 is demonstrated as a single battery. However, the battery 210 in FIG. 2 can represent a plurality of batteries electrically connected in series, parallel, or any series/parallel combination, such that the voltage $V_{BAT}$ could represent, for example, an aggregate voltage of serially connected batteries. In certain examples, the system can include multiplexing or switching circuitry (not shown) to selectively connect one or less than all of a plurality of batteries to a load, and to interconnect two or more of the batteries for controlled charging or discharging. In one example, the SOC calculated by the battery sense controller 205 is an average SOC of the plurality of batteries. The system includes one or more disconnect switches 209 operative according to signals from controller 205 to connect or disconnect the battery 210 to or from the host 290. In one example, the disconnect switches 209 disconnect the battery 210 from the host 290 in response to a determination that a short condition exists, which prevents the battery 210 from overheating or from adversely affecting the load.

The system 200 includes a temperature sensor 215 that is configured to provide a temperature signal T to the battery sense controller 205 located in an integrated circuit (IC) 207. The temperature signal T, in one example, is a signal associated with an actual temperature of the battery 210, such as based on an external sensor coupled directly to the battery 210, or, in another example, is a measure of an ambient temperature of an area surrounding the battery. As an example, the temperature signal T is a digital signal, such as provided by an analog-to-digital converter (ADC) that is part of the temperature sensor 215 or internal to the IC 207. In one implementation, an ADC 260 provides a signal to the battery sense controller 205 for battery voltage determination ($V_{BAT}$). In one implementation, an ADC 255 provides a signal to the battery sense controller 205 that represents the measured system current I_system flowing through the battery 210 and a sense resistor 253.

Figure 3:
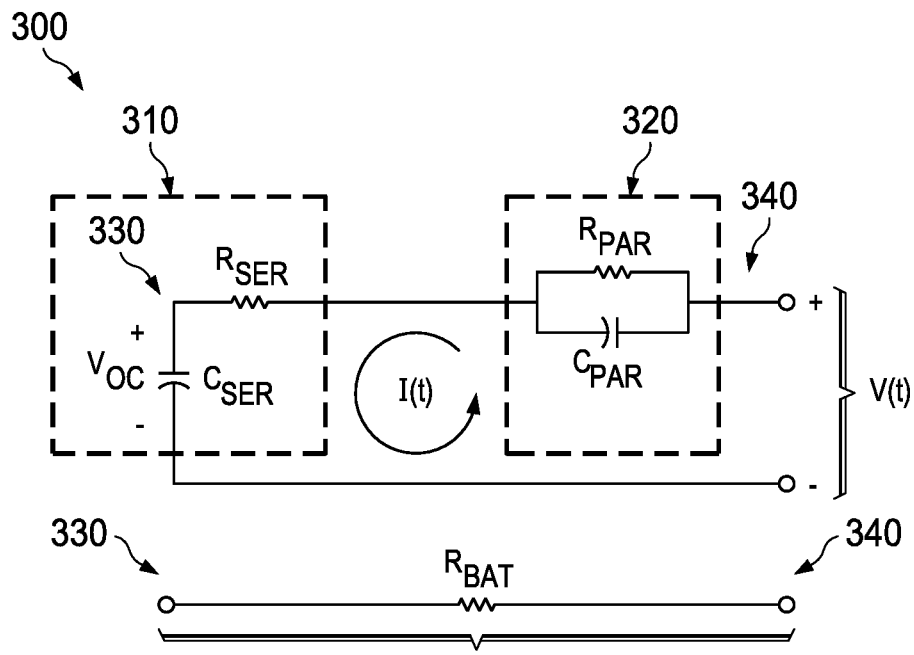
FIG. 3 illustrates an example of a dynamic battery model.

The IC 207 also includes a memory 220 that is configured to store battery model data 225 and previous battery data 230. In some implementations, the memory 220 includes a data flash (DF) (not shown) that is used, for example, to store model parameters. The battery model data 225 include steady-state behavior data 235 corresponding to steady-state behavior parameters of the battery 210 and transient behavior data 240 corresponding to transient behavior parameters of the battery 210. The steady-state behavior data 235 (e.g. data regarding the steady state circuit portion 310 of FIG. 3) and the transient behavior data 240 (e.g. data regarding the transient circuit portion 320 of FIG. 3), in one implementation, include data regarding a dynamic battery model having values that are dependent on the depth of discharge (DOD) of the battery 210. The IC 207, in one example, includes processor executable program instructions shown in FIG. 2 as a linear regression computation component 245 stored in the memory 220. In another implementation, the linear regression computation component 245 is a dedicated circuit of the IC 207. The controller 205, in one example, executes the instructions of the linear regression computation component 245 to perform the linear regression computations described herein. The IC 207 or the memory 220 may also include an error margin computation component 250 including processor executable instructions implemented by the controller 205 to perform the error margin computations described herein. In another example, the error margin computation functions can be implemented by a dedicated circuit of the IC 207. The battery model data 225, in one example, is generated for the battery 210 based on modeling the battery 210 as a dynamic battery model. FIG. 3 illustrates an example of a dynamic battery model 300 in accordance with one aspect. The dynamic battery model 300, in one implementation, corresponds to the battery 210 in the example of FIG. 2, and the following description of the example of FIG. 3 makes reference to the example of FIG. 2.

The dynamic battery model 300 includes a steady-state circuit portion 310 and a transient circuit portion 320 that are each configured as RC networks. Although in the embodiment of FIG. 3 the transient circuit portion 320 shows only one RC element, some embodiments include more than one RC element in the transient circuit portion 320. The steady-state circuit portion 310 includes a resistor $R_{SER}$ and a capacitor $C_{SER}$ that are arranged in series and the transient circuit portion 320 includes a resistor $R_{PAR}$ and a capacitor $C_{PAR}$ that are arranged in parallel. Although the example of FIG. 3 demonstrates a single parallel-coupled RC network for the transient circuit portion 320, the transient circuit portion 320 in one implementation includes multiple parallel-coupled RC networks, such as connected in series with each other, that collectively model the transient characteristics of the battery 210, in one implementation, as follows. The capacitor $C_{SER}$ corresponds to a voltage source (e.g. battery 210 of FIG. 2) of the dynamic battery model, and is modeled as having an associated open-circuit voltage $V_{OC}$ across it. The open-circuit voltage $V_{OC}$ corresponds to an instantaneous steady-state voltage of the dynamic battery model 300. The resistor $R_{SER}$ and the transient circuit portion 320 constitute a battery impedance between nodes 330 and 340 for the dynamic battery model 300 having a resistance $R_{BAT}$. The dynamic battery model 300 also has a sample voltage V(t) and an associated sample current I(t) corresponding to instantaneous magnitudes of the voltage and current of the dynamic battery model 300 at a given sample time. In this regard, as shown in FIG. 3, the sample current I(t) flows through both steady state circuit portion 310 and the transient circuit portion 320.

The dynamic battery model 300, in one example, is used to build a table of predetermined data associated with steady-state and transient behaviors of the battery 210, such as included in the battery model data 225 in the example of FIG. 2. As an alternative to the table, the battery model data 225 may be in the form of a parametric equation or equations. As an example, during testing for the particular chemistry of the battery 210, a predetermined load (not shown) is periodically coupled and decoupled to the corresponding test battery to measure a voltage response of the test battery through the life of the test battery. Operational characteristics of the battery 210 are obtained at predetermined DOD values of the battery 210. In one example, the operational characteristics of the battery 210 during the test are used to determine values for the open-circuit voltage $V_{OC}$, the capacitance $C_{SER}$, the resistance $R_{SER}$, the capacitance $C_{PAR}$, and the resistance $R_{PAR}$ at each of the predetermined DOD values of the battery 210. Such values are then used to build the battery model data 225 as a function of DOD of the battery 210.

Figure 4:
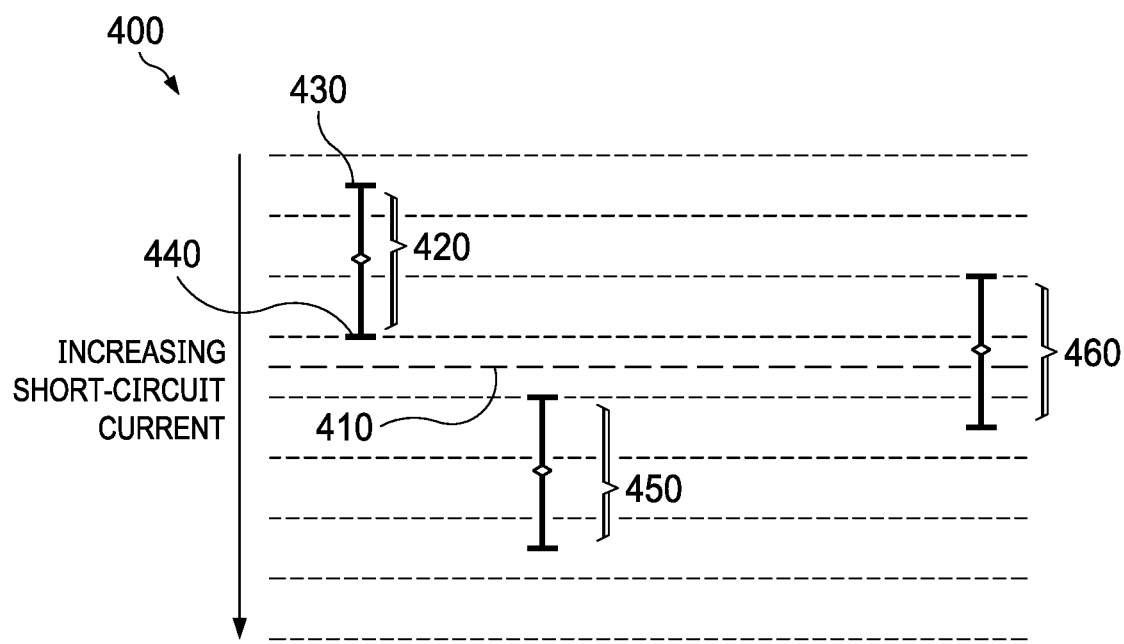
FIG. 4 is a graph showing illustrates a general principle of detection as discussed herein.

FIG. 4 illustrates a graph 400 showing a curve 410 representing an ISD detection threshold and example detection margins 420, 450 and 460. The margin 420 represents a confidence pass margin (e.g., the range above the threshold) with an upper value 430 that represents an ISD upper margin, and a lower value 440 that represents an ISD lower margin. The margin 450 shows a confident fail range (e.g., the range below the threshold). The margin 460 shows an uncertain range (e.g., the range encompassing the threshold).

In one example, the battery sense controller 205 includes a processing circuit that executes software or firmware to implement the processing in FIG. 100. In one implementation, the controller 205 initializes a dynamic model from measured voltage and current values at the time when abs(I_system)<I_quit current is detected (e.g. step 108 of FIG. 1). If this condition persists longer than a default time (referred to herein as data flash relax time if the battery is discharging (DF.Discharge) or data flash relax time (DF.Charge) (if the battery is charging), the system enters the relaxation mode and the dynamic model continues running. Otherwise, if the exit condition is interrupted, the update is stopped. The quit current is a parameter stored in memory 220. The quit current parameter represents the amount of time the system waits when the absolute value of the current goes below the quit current value I_quit before entering the relax mode, and the controller 205 operates the short circuit current detection (ISD) processing of FIG. 1. The DF.Discharge relax time is the time the system current I_system has to be below the quit current value I_quit before the system enters the relax mode from discharge. The DF.Charge relax time is the time current has to be below the quit current value I_quit before the system enters the relax mode from charge. In one example, the battery might be relaxed when it has not been driving a load for a prescribed amount of time. In one implementation, the controller 205 performs the internal short detection processing only in the relaxed state or mode because when there are higher currents it is more difficult to measure the small currents of a microshort. In one implementation, relax mode is exited if abs(I_system)>Iquit_relax for longer than a predetermined quit relax time value (see, e.g., steps 113 and 115 of FIG. 1).

In one implementation, various functions derive the dynamic model. The serial or series capacitance (Cser) is found as the battery cell capacity divided by derivative of a temperature dependent open circuit voltage (OCV) value OCV(dod,T) by DOD, where OCV(dod)=OCVa(dod)+OCVb(dod)*T, OCVa and OCVb are found with a table of OCV parameters used in temperature compensated open circuit voltage (OCV) equation, and DOD is the depth of discharge. In one example, the serial capacitance Cser is found from OCVa and OCVb tables, temperature, DOD and Qmax as shown below:

In one example, the controller 205 calculates CserT from the DOD and temperature by: (i) assigning boundaries (e.g. 0 and 38 as in the example implementation below) to the current, (ii) calculating first and second open circuit voltage (e.g. OCV) equations, and (iii) calculating the serial capacitance (e.g. the serial capacitance "s" as in the example implementation below) according to the open circuit voltage equations. One implementation of this is as follows:

$$i \leftarrow \text{floor (DOD 39)}$$
$$i \leftarrow 38 \text{ if } i > 38$$
$$i \leftarrow 0 \text{ if } i < 0$$
$$OCV1 \leftarrow Va_i + (Vb_i 10T)/2^{15}$$
$$OCV2 \leftarrow Va_{i+1} + (Vb_{i+1} 10T)/2^{15}$$
$$s \leftarrow QmaxC/(39|OCV2-OCV1|) \text{ if } OCV2 < (OCV1-2)$$
$$s \leftarrow QmaxC/(39 \cdot 2) \text{ otherwise}$$
$$s \leftarrow \text{if}(s < 1, 1, s)$$
$$s$$

In this example, QmaxC is capacitance in coulombs, and QmaxC=Qmax*3600. Also in this example, "i" is the current and "s" is the serial capacitance. In one implementation, an OCVa table is used for ISD.

Figure 5:
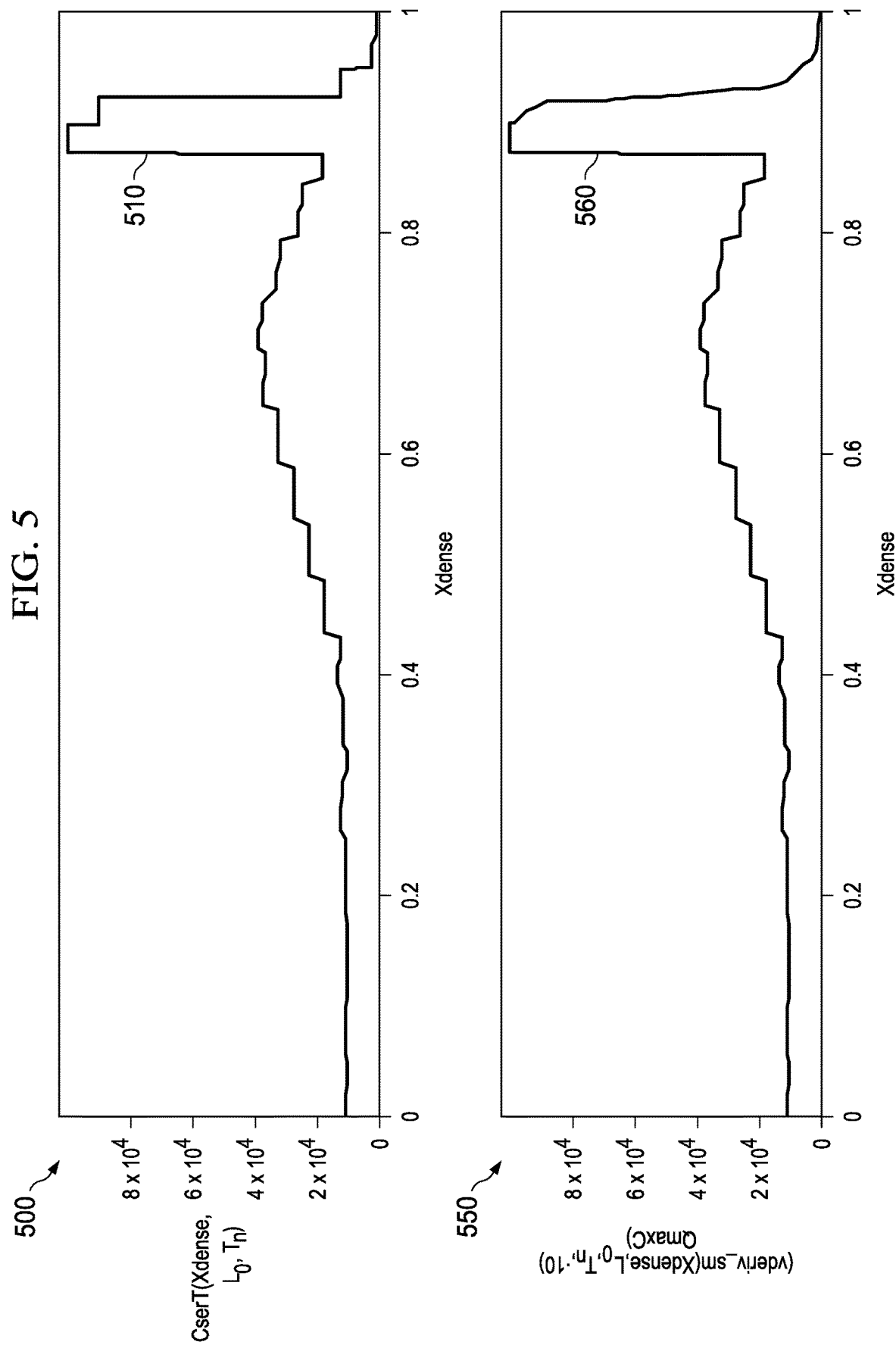
FIG. 5 illustrates two graphs in accordance with principles described herein.

FIG. 5 shows graphs 500 and 550 that illustrate battery properties as a function of density for a model battery 210. The graph 500 in FIG. 5 shows a curve 510 of CserT (Xdense, $L_0$, $T_n$) as a function of Xdense, and a curve 560 in the graph 550 illustrates (vderiv_sm(Xdense, $L_0$, $T_n$, ·10) QmaxC) as a function of Xdense. The dynamic battery model 225 (of, e.g., steps 102, 104, and 114 of FIG. 1), in some implementations, includes various model parameters, including: med_Rserk:=round (median(Rserk))=25, where Rserk is the median serial resistance Rser; med_clk:=round (median(clk))=81, where med_clk is the median capacitance ratio between C1 and Cser; and med_Ratio1:=round (median(ratio1))=180, where med_Ratio1 is the median ratio between R1 and Rtot. The illustrated example model 225 also includes the following parameters: DF.med_Rser value, the median of values stored in chemdat12 for Rser grids; and chemdat12 is an encrypted chemical database file containing all chem ID parameters; DF.med_C1 value; the median of values stored in chemdat12 for Rser grids; DF.med_Ratio1 value; the median of ratio between Rtotal and R1 values, stored in chemdat12. A model parameter Ratio table scale is a fixed scale factor of 32, and Rserfactor is set to a value of 0.9.

In one example implementation (of, e.g. step 114 of FIG. 1), the battery sense controller 205 computes Cser (e.g. the Cser of FIG. 3) from DOD. The battery sense controller calculates Cpar (e.g. the Cpar of FIG. 3). However, as mentioned above, some examples include more than one RC element. Thus, the following discussion and example implementation below refer to c1, c2 and so forth in place of Cpar. The battery sense controller 205 calculates Rser (e.g. the Rser of FIG. 3). The battery sense controller 205 calculates Rtot as Ra(dod,T)+Rcorr(dod). The battery sense controller 205 checks if Rser is smaller than min ratio to Rtot, cap to min ratio value. The battery sense controller 205 calculates r2 and r1 (similarly to the discussion above regarding Cpar, Rpar of FIG. 3 is referred to as r1, r2 and so forth). The battery sense controller 205 corrects Rser by R_trace and r2 values. The battery sense controller 205, if reinit=1 (on startup of dynamic model), performs assignment of previous state variables—OCV and vc1 e.g $X_0$ and $X_1$ from, DOD_present, v and I_new. If DODpresent>0.99, the battery sense controller 205 assigns a value of 0.99 to DODpresent. The battery sense controller 205, computes OCv value for present step. The battery sense controller 205, computes vc1 value for present step. The battery sense controller 205 assigns last step array values. The battery sense controller 205 assigns output values ($Y_0$ is total current or I_est). The battery sense controller 205 computes DOD using estimated current. The battery sense controller 205 assigns output $Y_1$ from DOD. The battery sense controller 205 recomputes the open circuit voltage OCV from DOD to take into account temperature. No update is performed in the negative DOD (overcharge) case. Furthermore, in this implementation, Rcorr(dod) is a function obtained by linear interpolation of a 40 grid point table of resistance correction values that accounts for resistance increase at low rates. The resistance corrected table is obtained from C/30 and C/50 discharge curves, and stored in memory 220 as 40 2 byte values. The resistance correction table corresponds to the same DOD values as the OCV table. The following shows an example implementation in the battery sense controller 205:

In one example, the controller 205 performs the computations at every sample of current and voltage:

Cser1 ← CserT(DOD,T)
c1 ← med_clk · ((Cser1)/ratiotablescale))
Rser ← ((med_Rserk · p)/(1000))
Rtotal ← DOD2RtotalT(DOD,T) · P
Rser ← Rtotal · Rserfactor if Rtotal · Rserfactor<Rser
r2 ← ((Rtotal−Rser)/(1+(med_Ratio1)/(ratiotablescale)))
r1 ← Rtotal−Rser−r2
Rser ← Rser+R_trace)+r2
r2 ← 0
if reinit=1
    $X_0$ ← fV0(DOD,T · 10)
    $X_1$ ← v−X0−I_new · Rser
$Xnew_0$ ← X0−((Ts)/(Rser · Cser1)) · ($X_0+X_1$−v)
$Xnew_1$ ← −((Ts)/(Rser · Cser1)−1) · X1−((Ts)/(Rser · cl)) · ($X_0+X_1$−v)
X ← Xnew
$Y_0$ ← ((v−$X_0$−$X_1$)/(Rser))
DOD ← DOD−(($Y_0$ · Ts)/(QmaxC))
$Y_1$ ← DOD
$X_0$ ← if(DOD>0∧DOD<1,fV0($Y_1$,T·10),$X_0$)
$out_0$ ← Y
$out_1$ ← X
out In one implementation, the current calculation from 1RC dynamic model: IS_I=Y[0]−I_system, where I_system is the instantaneous current measured during the same time interval as voltage (0.25 sec).

Figure 6:
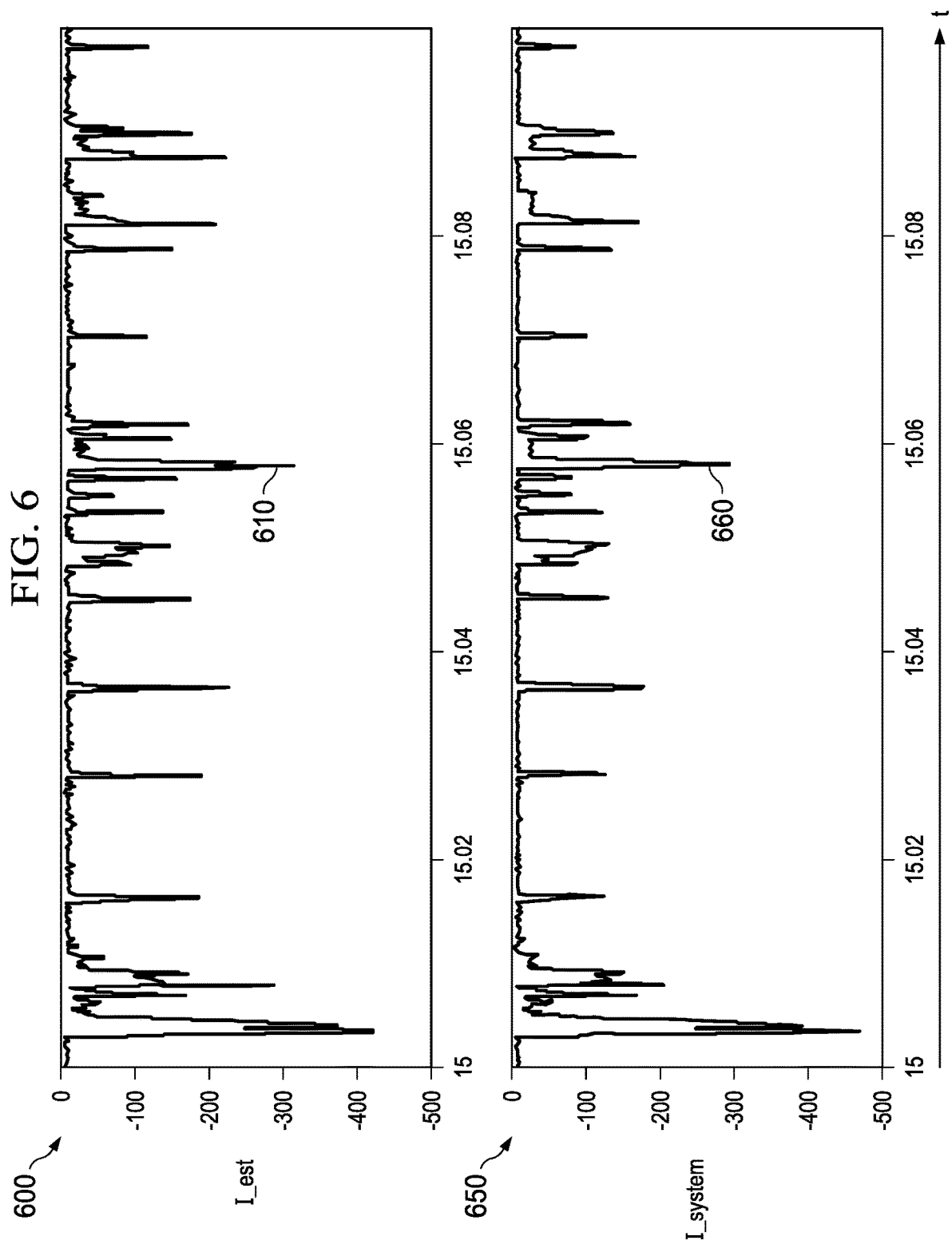
FIG. 6 shows graphs illustrating an estimated current and a system current.
Figure 7:
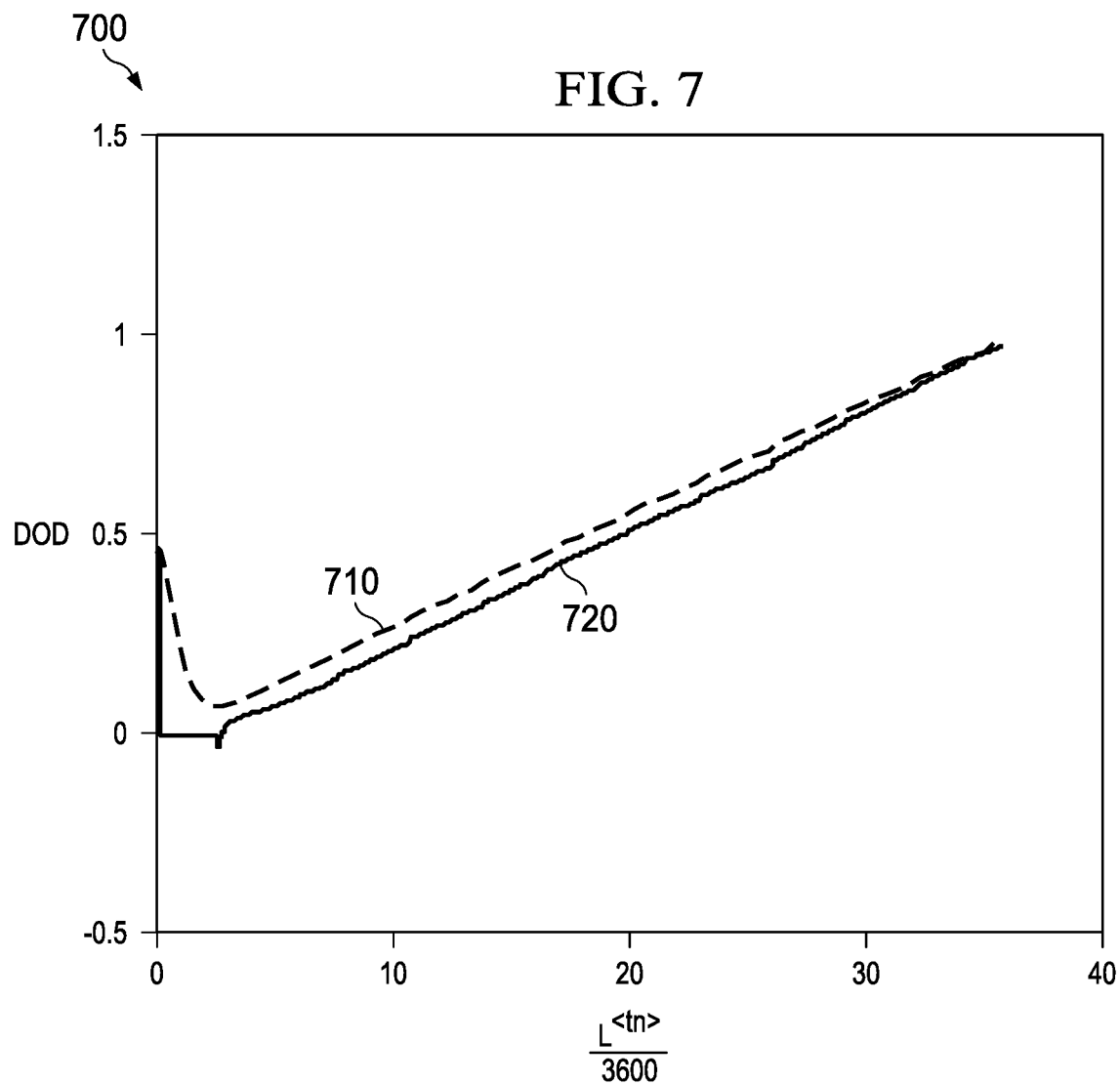
FIG. 7 shows a comparison of dynamic model depth of discharge (DOD) with true DOD.

Referring also to FIGS. 6 and 7, FIG. 6 shows a graph 600 including the computed estimated current value I_est (curve 610), as well as a graph 650 that includes a curve 660 showing the system current I_system. FIG. 7 shows a graph 700 including a curve 710 representing the DOD computed according to the model-estimated current, as well as a curve 720 representing the actual DOD computed using the system current measured system parameters. As seen in FIG. 6, the estimated current value I_est (curve 610) is a close approximation or estimate of the actual measured system current I_system (curve 660) as a function of time, even in extremely dynamic loading conditions. In this regard, the relatively high negative current spikes seen in the actual measured system current 660 are closely modeled by the computed estimated current value I_est. In addition, the modeled DOD (curve 710) is substantially equivalent to the actual DOD as shown in the graph 700 of FIG. 7. The use of the steady-state and transient behavior characteristics in the battery model 225 (FIG. 2) facilitates accurate assessment and monitoring of detectable short conditions in the battery 210.

In the above examples, the controller 205 computes linear regressions (e.g., 118 in FIG. 1 above) to compute the smoothed current (e.g., IS_I_SMOOTH). The controller 205 in this example also computes a 1000 second regression (e.g., IS_I1000). In another implementation, a 500 second regression is used for the smoothed current representation (e.g., IS_I500). Other values can be used in different implementations. The illustrated controller 205 accumulates two sets of linear regression sums. In one example, all data points are added, and there is no rejection of data points. This example illustrates an advantage of the example systems and methods, where even noisy data points are still utilized to at least some extent. One regression is accumulated with DF.fastISD_dt, for example with a default 100 sec accumulation interval for "fast ISD" current estimation. In this example, the second regression is accumulated with a longer interval DF.smoothISD_dt (e.g., default=1000 sec) for the "smooth ISD" estimation. The fast ISD is used to detect events exceeding a high ISD threshold, and a smooth ISD is used to detect "low" ISD threshold. In one implementation, the linear regression for the smoothed current is computed in parallel with the linear regression for the fast current.

Example regression functions are given below.
Sums update every step:

$$S \leftarrow S+1$$
$$Vy \leftarrow Vy+((S-1)/S)*(x-Mx)^2$$
$$Vy \leftarrow Vy+((S-1)/S)*(y-My)^2$$
$$Cp \leftarrow Cp+((S-1)/S)*(x-Mx)*(y-My)$$
$$Mx \leftarrow Mx+((x-Mx)/S)$$
$$My \leftarrow My+((y-My)/S)$$

Where S sum or regression points; Vy combined statistical sum; Mx statistical sum of X value; My statistical sum of Y values; Cp combined X and Y values statsum.

Output of the regression:

$$b \leftarrow (Cp/Vx)$$
$$a \leftarrow My-b*mx$$
$$y \leftarrow a+b*x$$
$$av\_sigma \leftarrow ((Vy-b*Cp)/(S-2))^{1/2}$$
$$\sigma a \leftarrow ((Vx+S*Mx^2)/(S*Vx))^{1/2}*av\_sigma$$
$$\sigma b \leftarrow ((1/Vx)^{1/2}*av\_sigma$$
$$Covab \leftarrow (-Mx/Vx)$$
$$Covab \leftarrow Covab*av\_sigma^2$$
$$\sigma y \leftarrow \sigma a^2 + \sigma b^2*x^2 + 2*Covab*x$$

In the example regressions above, a and b are parameters of the linear equation: y=b+a*x, where av_sigma is the average sigma value (e.g., average deviation) of the regression; sa is the deviation sigma of a, sb is the deviation sigma of b, and Covab is covariance of a and b. After the number of computations exceeds a maximal time value (DF.fastISD_dt or DF.smoothISD_dt), the controller 205 stops computing the corresponding regression output, and the resulting values of a and sigma_a are used for the error margin computation (e.g., at 119 in FIG. 1). In one example, DF.fastISD_dt is the interval to apply the regression for fast samples, e.g., 100 sec default, and DF.smoothISD_dt is the interval to apply the regression for fast samples, e.g., 500 sec default. In one implementation, the value of a is the average currents IS_I100 and IS_I1000, and the values of sigma_a are used to compute confidence intervals as described below (e.g., at 118 in FIG. 1).

In one example, the "Present DOD" is calculated as follows. PresentDOD is reported by a transient modeling function along with I_total as Y[1]. After exiting the relaxation mode, DOD0=PresentDOD is assigned. It is also qualified for Qmax update (e.g., the maximal chemical capacity of the cell if charged to maximal allowed voltage and discharge to minimal allowed voltage at close to zero discharge rate, if other conditions such as dSOC and dQ are satisfied, where dSOC is the change in SOC and dQ is the change of charge Q. Since present DOD_dvc has been initialized from the previous DOD0 and passed charge estimate, and since the dynamic model enforces convergence to true DOD during rest, the new PresentDOD is a more accurate value compared to the previous one, even if full relaxation has not been reached. In one implementation, the controller 205 computes the estimated present DOD as dod0+Qpass/Qmax from a gauging algorithm, where Qpass is the amount of passed charge since dod0 was taken.

These DOD calculations are used in the computation of the confidence intervals. In order to ensure that short circuit current is higher than a pre-defined threshold within the accuracy of the measurement, in one implementation, 90% confidence intervals for both fast ISD and smooth ISD measurements are computed. Other confidence intervals can be used in other implementations. In one example, the controller 205 computes a confidence interval dI according to the following equation:

$$dI = sigma\_a*corr\_factor*6.63 + |((I\_est*QmaxC)/CserT(dod,T))*err\_dDODdV| + OffSetError$$

In this example, DOD_used is the last DOD reported as Y[1] by the dynamic model 225, and sigma_a is standard deviation for the intercept obtained from regression (e.g., obtained at step 118 of FIG. 1). A correction factor corr_factor is from regression statistics to actual one sigma variance, and the controller 205 uses different corr_factor values for the fast computations (e.g., DF.corr_factor_fast=1.18) and the smooth computations (e.g., DF.corr_factor_smooth=1.14). 6.63 is a multiplier from one sigma value to 99% confidence interval in this example. Other values might be used for different confidence intervals; for example, 2.71 might be used for a 90% confidence interval. The value err_factor=DF.gain error % {1, 2 and 3}/100 is an example for the present DOD region. In one example, different DOD value ranges are used to define a set of DOD regions, where a region is selected depending on DOD_DVC and DF.UpperDOD % 1, 2 and 3 settings. The gain error and region boundaries are expressed as one byte integers representing % value in one example. Table 1 below illustrates example defaults, where all values are chem ID specific, and can be programmed by bqstudio from an encrypted chemdat file. A constant lower boundary is zero, and a constant upper boundary is 100%, where a Gain error value of 255 disqualifies the region. In one example, an error byte[4] is set to 1 if the DOD is above region 3, or if the gain error is set to 255 in the present DOD region.

TABLE 1

|  | N region | | |
| --- | --- | --- | --- |
| Name | 1 | 2 | 3 |
| Upper DOD, % | 20 | 40 | 80 |
| Gain error, % | 10 | 15 | 12 |

In another example, the table can be extended by zero and 100% rows:
dod_gain_error=

$$\begin{pmatrix} 0 & 25 & 45 & 85 & 100 \\ 255 & 10 & 15 & 12 & 255 \end{pmatrix}$$

In one example, the controller 205 indexes the gain error from Table 1 using the following:

```
get_gain_error(dod):= last ← −1
    for i ∈ 0..4
        last ← i if dod > ((dod_gain_error_{0,i})/(100))
        last ← if(last>3,3,last)
    dod_gain_error_{1,last+1}
```

I_est is average current reported by dynamic model during last regression interval. I_est=(dvd_dod[i]−dvc_dod[i−1])*−QmaxC/dt, where dt is (DF.fastISD_dt or DF.smoothISD_dt) depending on the interval type, and where dvd_dod[i] is the DOD that is estimated by RC transient model (DVC engine). OffsetError is computed from CC deadband and sense resistor value: OffsetError:= ((CCdeadband*116)/(CCGain*1000))=1.013592, where CCGain is the value of the sense resistor.

The following describes the end of transient detection and transient error calculation. The controller 205 uses IS_I_S-MOOTH currents to calculate transient error and to detect end of transient, and the controller 205 adds the transient error to the error margin (e.g. 119 of FIG. 1) computation until the end of transient is detected. In this example, two types of transients are accommodated, including an initial relaxation onset transient, and a secondary transient during rest. The controller 205 also sets a transient bit under two disqualification conditions (e.g. used in step 118 of FIG. 1). The first disqualification condition is where the average system current is too high, for example, due to average system currents>DF.maxI=10 mA or <DF.minI=−45 mA. In one implementation, DF.maxI is the maximal sense resistor current that is allowed without disqualifying a point. This disqualification helps to prevent errors when system high current occurs for period less than the quit relax time but long enough to make a transient distortion. A second example disqualification is for an ISD change above 3× of the total error margin or where the average ISD current changes more than the total error margin. This can happen, for example, where the estimated ISD current has changed due to the onset of an ISD event. Both of these checks apply to fast and smooth regression samples. The controller 205 in one example maintains a bit array "disqual_array" to track all disqualifications for each fast_dt and smooth_dt currents. Both are reported by extended sbs command as a status byte, with above values placed in disqual_ar[0] and [7] correspondingly.

Other example disqualification settings can be used in other examples (e.g. used in step 118 of FIG. 1). In one example, the controller 205 maintains an array with the following contents:

$$\text{Disqual\_name} := \begin{pmatrix} \text{"sys current too high"} \\ \text{"}dI_{ISD} > \text{variance"} \\ \text{"flat\_points"} \\ \text{"variance above level"} \\ \text{"blocked soc range"} \\ \text{"}\frac{dT}{dt}\text{ above limit"} \\ \text{"no qualified }dI\text{"} \\ \text{"dI\_ISD} > 3\text{x\_margin"} \end{pmatrix}$$

In certain examples, the controller 205 resets the smooth second regression accumulation in response to detection of a transient for either of the above conditions in a 100 second regression point resets smooth regressions data collection. In one example, the controller 205 resets the regression by setting a bit ISD_on=0 as an input to a regression function if either of the conditions occurs. In this example, the system is in the relax mode and ISD detection is active when the ISD_on bit is 1. If this bit is 0, a flag active=0 is set, which will prevent a regression sum function to return at tpresent−tlast>dt, where tpresent is the present time. Once ISD_on=1 is set again (e.g., when above disqualifications are both cleared by one of the next 100 sec samples), the regression sums for smooth_dt will reset, and active=1 will be set which will again allow the processing to return the smooth_dt regression sum. Transition to active=1 will also cause setting of tlast=tpresent and transient_bit=1. In one implementation, tlast is the time when transient has started. In one example, transient_bit is a bit which indicates that the end of transient is detected, so the controller 205 will no longer add the transient error in the error margin computation. The following illustrates this logic, where the "i" loop will be called every time instantaneous current is read out. ISD_on_orig corresponds to ISD_on settings based on entering relaxation mode, and ISD_on are settings that indicate ISD disqualification coming from "fast" current. They both have an effect on onset of transient mode, but only the ISD_on_orig has an effect on setting "primary" transient in this example. In one implementation, ISD_on_orig is the bit indicating that transient mode is interred, copied as _orig so it is not overwritten. In one example, the new value in ISD_on are values that are not disqualified by 100 sec interval regression point.

```
Foutall(dt, ISD_on, ISD_on_org):=        cnt←0
Cnt2←0
tlast←L_{0,m}
X←nul
Y←nul
active←0
start←0
first_start←0
for i ∈ 0..rows(L)−1
    if (ISD_on_i=1∨ISD_on_orig_i=1) ∧ active=0
        active←1
        sums←clearstatsum(nul)
        regs←clearstatsum(nul)
        Tmax←L_{i,Tn}
        Tmin←L_{i,Tn}
        t1←0
        t2←0
        starts←1
        first_start←1 if i>0 ∧ (ISD_on_orig_{i-1}=0 ∧ISD_on_orig_i=1)
        tlast←L_{i,m}
    active←0 if ISD_on_i=0
    if active=1
        sums←adregpoint(L_{i,m}−tlast,Isc_dvc_i,sums)
        if Tmax< L_{i,Tn}
            Tmax←L_{i,Tn}
            t1←L_{i,m}−tlast
        if Tmin>L_{i,Tn}
            Tmin←L_{i,Tn}
            t2←L_{i,m}−tlast
        cnt←cnt+1
    dtlast←L_{i,m}−tlast
    if (dtlast)≥dt/∧active=1
        regs←evalreg(sums,L_{i,m}−tlast)
        out_{cnt2,2}←regs_2
        out_{cnt2,1}←regs_1
        out_{cnt2,0}←L_{i,m}
        out_{cnt2,3}←regs_3
        out_{cnt2,4}←regs_4
        out_{cnt2,5}←regs_5
        out_{cnt2,6}←regs_6
        out_{cnt2,7}←regs_7
        out_{cnt2,8}←regs_0
        out_{cnt2,9}←L_{i,vn}
        out_{cnt2,10}←dod_dvc_i
        out_{cnt2,11}←L_{i,Tn}
        out_{cnt2,12}←start
        out_{cnt2,13}←first_start
        out_{cnt2,14}←Tmax−Tmin
        out_{cnt2,15}←if( | t2−t1 | >dtmin, ( | (Tmax−Tmin)/(t2−t1) | ),0)
        out_{cnt2,16}← | (t2−t1) |
        out_{cnt2,17}←L_{i,inactive}
        out_{cnt2,18}←rest_mode_i
        out_{cnt2,19}←ISD_on_i
        out_all←0
        cnt2←cnt2+1
        cnt←0
        X←nul
        Y←nul
        tlast←L_{i,m}
        Tmax←L_{i,Tn}
```

```
    Tmin←L_{i,Tn}
    start←0
    first_start←0
    sums←clearstatsum(nul)
out1_0←out_all
out1_1←out
out1
```

Primary transient, in one implementation, includes intermediate peaks (increase followed by decrease), so the usual method of end of transient detection is not used in one implementation. At the beginning of rest, a flag first_trans=1 is set to indicate that primary transient treatment is applied. In this case, end of transient detection is delayed by time<DF.max peak time (default 3600 sec). In one implementation, DF.max peak time is the time to wait before detecting and of transient in case of first transient. Transient time trans_time counter resets to zero at the beginning of relaxation and is used for peak time treatment and also in transient error calculation below. In one implementation, the trans_time is the time from the beginning of the transient. In one example, the first_trans bit indicates that this is the first transient during this relaxation period, so max_peak_time waiting has to take place before any points is taken because transient could have a peak rather than constant decline. During this period when trans_time<DF.max peak time AND first_trans=1, all current points with "flat" current change could correspond to a peak, so such points are disqualified (qual=0 is set). "Flat current points" are defined as points that satisfy condition:

$$|dI|<((dI\max_i)/(dI\mathrm{div}))\wedge |dI\mathrm{last}|<((dI\max_i)/(dI\mathrm{div}))$$

where dImax is error margin estimated for this point, dI is difference in internal short current I_IS[i] and I_IS[i−1], and dIlast is difference in I_IS[i−1] and I_IS[i−2]. Once trans_time>=DF.max_peak_time, when a "flat points" condition is satisfied, an end_transient bit is set and first_trans=0 is set. Adding transient error estimate to error margin stops at this point (when end_trans=1), where end_trans shows if the end of transient is detected. In one example, the end_transient bit indicates that transient has ended. Secondary transients treatment starts when Icc_av>DF.maxI or dI>DF.max_dI are detected, and afterwards current goes below maxI and dI<DF.max_dI. At this point, transient time counter trans_time resets to zero and end_transient bit sets to zero. Once flat point is detected, end_trans is set to one. Adding transient error estimate to error margin stops at this point (when end_trans=1). In one example, Icc_av is the average sense resistor current. Transient qualification is performed only for "smooth" currents, and resulting end_trans bit and transient error estimates are applied to both fast and smooth current error estimates.

Transient error is estimated as an extrapolation of dI in average ISD current between the points, extrapolated linearly for the period until the estimated end of transient effect. A maximal duration of the transient effect is defined as DF.max_trans_time (default 7200 sec). In one example, DF.max_trans_time is the data-flash parameter for maximal possible transient duration, used in calculation of transient error, where trans_time (a time from beginning of transient) is used to calculate remaining time until the end of transient, and is given by the following: trans_left=DF.max_trans_time−trans_time. Extrapolating conservatively, which assumes that dI will never change, a maximal transient error estimate is computed as: trans_error=trans_left*dI_selected/1000, where the current is assumed in mA and time in seconds. In another example, trans_error is the transient error, and is calculated as dI*(max_trans_time−trans_time). In this example, dI_selected is the value of dI, which absolute value is largest between abs(dI) and abs(dI_last). This assures that dI is not picked from a flat portion that is not disqualified by "flat" criteria.

Trans_error is reported and added to error margin for both I_smooth and I_fast if end_trans=0. If end_trans=1, zero is zero is reported instead. Since transient errors are asymmetrical, they are added differently to upper and lower margins, depending on the sign of error and sign of present current. To calculate margins, trans_err_pi (p is for plus) is added to the estimated value of I_IS, and trans_err_mi (m is for minus) is subtracted from the estimated value of I_IS. The transient error direction is dependent on the direction of change, as described below:

$$\mathrm{trans\_err\_}m_i:=\mathrm{if}(\mathrm{peak\_watch}_i, |\mathrm{trans\_err3}_i|, \mathrm{if}(\mathrm{trans\_err3}_i>0,0, |\mathrm{trans\_err3}_i|))$$

$$\mathrm{trans\_err\_}p_i:=\mathrm{if}(\mathrm{peak\_watch}_i, |\mathrm{trans\_err3}_i|, \mathrm{if}(\mathrm{trans\_err3}_i<0,0, |\mathrm{trans\_err3}_i|))$$

In one implementation, when transient time is less then max_peak_time, transient error is added to both minus and plus margins, because direction of movement is undefined in case of peak.

In one implementation, it is applied only on smooth data, and then trans_err_m and trans_err_p is applied to both smooth and fast margin calculations. The controller 205 computes the upper and lower margins as follows:

$$\mathrm{ISD\_upper\_margin}=\mathrm{ISD\_value}-\mathrm{variance\_error}-\mathrm{gain\_error}-\mathrm{offset\_error}-\mathrm{trans\_err\_}m$$

$$\mathrm{ISD\_lower\_margin}=\mathrm{ISD\_value}+\mathrm{variance\_error}+\mathrm{gain\_error}+\mathrm{offset\_error}+\mathrm{trans\_err\_}p$$

In one example, ISD_value is the estimated 100 second or 500 second IS value. In one example, variance_error=sigma_a*corr_factor*6.63; where 6.63 is a multiplier dependent on a confidence interval desired (e.g., 90% confidence interval). In one example, gain_error is (I_est*err_factor)/(1−err_factor).

In certain examples, points are disqualified based on I_smooth average current not satisfying max system current or max total current change criteria. A disqualification bit applies to both I_smooth and I_fast currents. A Qual bit is set to zero if a flat point is detected during Max_Peak_time period as described above, or if −Iav_cc>DF.maxI. In one implementation, Iav_cc is average cc current, that is found as abs(Q_cc−Q_cc_before)/dt where dt is 1000 sec, Q_cc present coulomb count, Q_cc_before coulomb count after previous interval. In one implementation, the Qual bit indicates that the mean present 100 or 500 sec point is qualified (e.g., all bits in the disqualification byte are zero). In one example, Iav_cc is the average sense resistor current. In one implementation, Q_cc is the coulomb count based on sense resistor current. In one example, Q_cc_before is the coulumb count before beginning of present 100 or 500 second data collection interval. Computing dI for transient error requires that both previous and present point are qualified by Iav_cc>DF.max-I criteria. In one implementation, counters for qualified points are used to verify that no less than 2 points has been collected. In one example, DF.maxI is the maximal system current otherwise disqualified. If less than 2 points have been collected, error bit [6] "no qualified dI" is set for both dI_smooth and dI_fast. (Where, e.g., dI_smooth is the difference between two subsequent smooth IS current points).

In certain examples, the dI based transient error is only computed from dI_smooth computations, so same value of trans_error is used for both dI_smooth and dI_fast upper and lower margins computation. Additionally, in one implementation, both I_fast and I_smooth points are disqualified if variance contribution to 99% confidence interval (defined, e.g., as sigma_a*corr_factor*6.63) for a given point exceeds the absolute value of a corresponding detection level. For I_smooth this is abs(DF.Max_ISC_low), and for I_fast it is abs(DF.Max_ISC_high). This is to exclude detection under abnormal noise conditions. In one implementation, DF.Max_ISC_low and DF.Max_ISC_high are two thresholds to detect internal short (high and low).

Certain examples also involve temperature disqualification (at, e.g., step 118 of FIG. 1). A maximum battery temperature Tmax is found during the regression data collection for I100 and I1000 intervals, where t1=t−tlast at the time Tmax is saved, Tmin is found during regression data collection, t2=t−tlast at the time Tmin is saved. When t−tlast>dt is satisfied, dTdt=abs ((Tmax−Tmin)/(t2−t1)) is found, if t2−t1>50 sec to avoid recording noise. If dTdt>DF.dTdt_max_hr/3600, interval is disqualified, bit "too fast T change" is set. A maximum temperature change value dTdt_max_hr is the maximal change in degree per hour, default is 30 (means 5 C in 10 min).

A Mathcad implementation is used in one example to detect the end of transient, transient error estimation and qualification bit setting. In one example, the Mathcad implementation is executed only for I_smooth ISD current, and resulting qual and transient bits are used for both. In this example, Iar is averaged ISD current for smooth_dt, Isigma_inp is the error margin computed for I_smooth current (without transient error) and dImax is the variance error part of error margin. Iavar is the I_est=the smooth_dt average of total RC model current I_est. Iavar_cc is averaged coulomb counter current over the same period, t is time array and start is array indicating if rest period has started after charge or discharge (has 1 at rest start, otherwise zero). In the example implementation below, dI is the ISD current change, ttrans represents the time since start of transient, trans_left represents the estimated remaining transient duration, trans_error represents the transient error estimate, and ncp is 1 if a flat point detected, where Isigma_inp>255 means outside of the SOC range:

```
Fqual(Iar,dImax,Isigma_inp,Iavar,Iavar_cc,tar,start,first_start,dTdt,level,dtinp):=
disqual_ar_0 ← disqual_nul
first_trans ← 1
trans_finish ← 0
trans_error_0 ← max_trans_error
dIlast ← 0
t_start_trans ← tar_0
trans_pnt_cnt ← 0
for i ∈ 1..rows(Iar)−1
    disqual ← disqual_nul
    disqual0 ← if(Iavar_cc_i>Iav_max∨Iavar_cc_i<Iav_min,1,0)
    dI ← Iar_i−Iar_{i−1}
    ttrans ← tar_i−t_start_trans
    if max_trans_time−ttrans<0
        disqual_1 ← if(| dI | >dImax_i,1,0)
        disqual_3 ← if(dImax > | level | ,1,0)
        disqual_7 ← if(| dI | >Isigma_inp_i*3,1,0)
    dIav ← Iavar_i−Iavar_{i−1}
    trans_left ← if(max_trans_time−ttrans>dt3,max_trans_time−ttrans,dt3 ¬disqual_1
    trans_error_i ← if(| dI | > | dIlast | ,dI,dIlast)*((trans_left)/(dt3))
    ncp ← (| dI | <((Isigma_inp_i)/(dIdiv))∧ | dIlast | <((Isigma_inp_i)/(dIdiv))∧i>1
    ISD_on_i ← ¬disqual_0∧¬disqual_7
    qual_i ← 0
    if ISD_on_i          if ttrans<max_peak_time∧first_trans=1
            qual_i ← if(ncp,0,1)
            disqual_2 ← if(dtinp=dt3, ¬qual_i,0)
        otherwise
            if ISD_on_i
                qual_i ← 1
                if ncp∧Isigma_inp_{i−1}≠255
                    trans_finish ← 1
                    first_trans ← 0
            qual_i ← 0 otherwise
    if(¬ISD_on_i)
        trans_finish ← 0
        t_start_trans ← tar_i
        trans_pnt_cnt ← 0
        first_trans ← 1 if first_start_i=1
    trans_i ← trans_finish
trac("i={0}",_i)
disqual_4 ← if(sigma_inp_i=255,1,0)
disqual_5 ← if(dTdt_i>dTdt_max,1,0)
trans_pnt_cnt ← if(¬disqual_0,trans_pnt_cnt+1,trans_pnt_cnt)
disqual_6 ← if(trans_pnt_cnt≥min_trans_pnt,disqual_2,1)
trans_error_i ← if(trans_finish=1,0,trans_error_i)
dIlast ← dI
disqual_ar_i ← disqual
ttrans_ar_i ← ttrans
trans_pnt_cnt_ar_i ← trans_pnt_cnt
        out_0 ← disqual_ar
        out_1 ← trans
        out_2 ← trans_error
        out_3 ← ISD_on
```

```
out₄←trans_pnt_cnt_ar
out₅←ttrans_ar
out
```

In one example, if there is a flat point, and not outside of SOC range, the end of transient is detected (but only if dtinp=dt3, which means dI_smooth and not dI_fast is being processed). In one example, there is no flat portion disqualification for dI_fast. If disqualified, the secondary transient starts. In one implementation, transient error is only added to margin if end of transient not detected.

Figure 8:
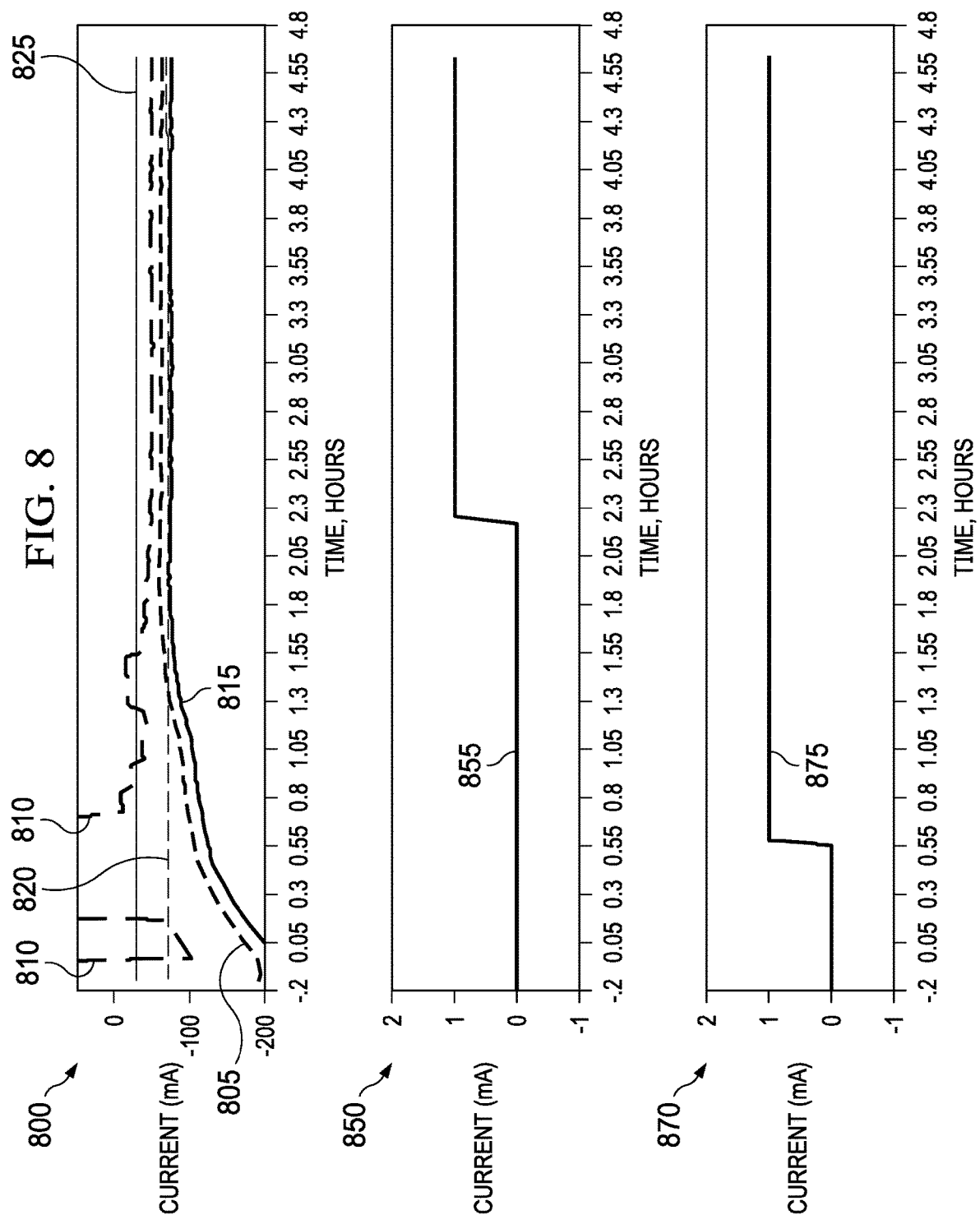
FIG. 8 shows a first example of internal short current.
Figure 9:
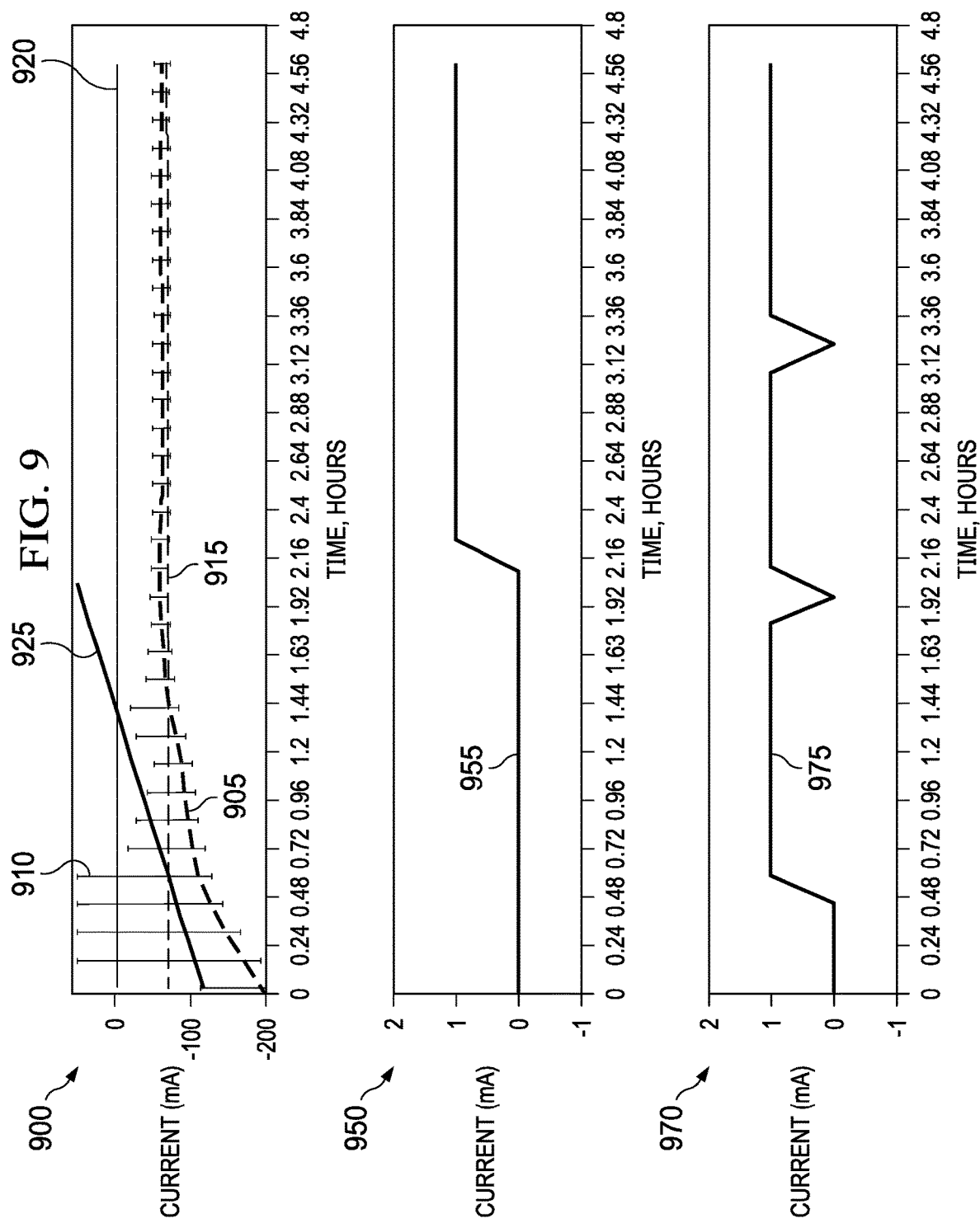
FIG. 9 shows a second example of internal short current.

Referring now to FIGS. 8 and 9, example estimated current results are illustrated for smooth and fast current cases, respectively, 20 mA average current operation with high transient (e.g., spiky) standby current. A graph 800 in FIG. 8 shows a curve 805 representing the estimated current I_est for the smooth case the, as well as an error margin curve 810, a margin curve 815, a true current curve 820, and an ISD level high curve 825. A graph 850 in FIG. 8 shows a corresponding qualified bit curve 855, and the graph 870 shows a curve 875. FIG. 9 includes show graphs 900, 950 and 974 the smooth ISD. The graph 900 includes an estimated current curve 905, an error margin curve 910, a true current curve 915, a qualified bit curve 920, and a curve 925. The graph 950 shows a curve 955, and the graph 970 shows a curve 975.

In one implementation, both the fast ISD and smooth ISD currents and their lower and higher confidence margins dI_fast and dI_smooth are reported during rest mode. In one implementation, all values are reported continually along with "qualified" and "transient_end" bits, and byte indicating disqualification reasons. During discharge and charge a zero ISD value is reported. Upon entry of relax mode, previous ISD value is reset to zero, so initially zero will be reported until first reading is taken. Detection of ISD events starts when qualification conditions are satisfied and transient bit is set. Both low ISD and high ISD levels, in one example, are detected either from fast ISD or smooth ISD currents, if current+margin<–level (note that current is negative, margin is positive). However, it is less likely that low ISD level will be detected from fast current unless it is drastically exceeded due to much larger margins. There is an option to disable low ISD level detection from fast ISD current reading (enabled by default).

Low ISD level detection, in one example, is enabled using "AC adaptor connected" command, or automatically. This choice is set in memory 220. Require_AC_adaptor command (default=0). If set to zero, Low ISD level detection will be ON automatically, but without it, it will only happen in command is given. This test continues every fast_dt and smooth_dt intervals (default 100 and 500 seconds) that have qualified currents available. After every attempt, ISD_high_retry_count and ISD_low_retry_count are incremented. After DF.ISD_detect_attempts (default=3) negative detection attempts, detection stops to save power, and resumes after DF.ISD_detect_retry_time (default=5 hr). In one implementation, ISD_high_retry_count is how many times confident pass for high threshold is detected; and, ISD_low_retry_count is how many times confident pass for low threshold is detected. In one implementation, DF.ISD_detect_attempts indicates a number that, when retry count reaches, indicates to stop detecting and to go to sleep. In another implementation, DF.ISD_detect_attempts indicates a number of confident faults until permanent failure ISD is set. In one implementation, DF.ISD_detect_retry_time indicates when to wake-up time to restart detection.

Another aspect relates to the detect_retry_time expiring. On power up, the IC 207 is in "manufacturing mode" and the controller 205 uses a shorter retry time DF.ISD_manufacturing_retry_time (default=1 hr). The value returns to a normal retry time by a host command "ISD_In system" from the host 290. In one implementation, a value DF.ISD_manufacturing_retry_time indicates the wake-up time to restart detection if manufacturing mode is enabled (usually shorter).

Another aspect relates to low ISD level detection, where ISC_low_alert shows if one or more confident low threshold fails has been detected. In one example, ISC_low_alert is a bit that is set when confident detection of IS low threshold took place. In one implementation, an "inactive mode" command is used to enable Low ISD Level detection when battery is inactive (for example if AC adaptor is plugged in but charging is finished), which otherwise would be disabled to avoid wrong detection under noisy conditions.

In certain examples, an "inactive mode" command is used to enable Low ISD Level detection when the battery 210 is inactive, for example, if AC adaptor is plugged in but charging is finished, which otherwise would be disabled to avoid wrong detection under noisy conditions. The low IDS level detection is demonstrated by the below example (see, e.g., steps 120 and 136 of FIG. 1).

```
If ISD_smooth_upper_margin < -DF.Max_ISC_low (default 4
   mA) is detected, counter
ISD_low_fault_cnt is incremented by 1, ISD_low_pass_cnt = 0
   OR
   (if enabled)
   If ISD_fast_upper_margin < -DF.Max_ISC_low (default 4 mA) is
   detected, counter
ISD_low_fault_cnt is incremented by 1, ISD_low_pass_cnt = 0
   Otherwise
   If ISD_smooth_lower_margin > -DF.Max_ISC_low (default 4
   mA) is detected, counter
ISD_low_pass is incremented by 1, ISD_low_fault_cnt = 0
   OR
   (if enabled)
   If ISD_fast_lower_margin > -DF.Max_ISC_low (default 4 mA) is
   detected, counter
ISD_low_pass_cnt is incremented by 1, ISD_low_fault_cnt = 0
   ISC_low_alert =1 bit is set if
   ISD_low_fault_cnt>0
   Sleep mode is disabled if ISD_low_alert flag is set.
   Check if ISDlow_fault_cnt > DF.Max ISDlow_fault_cnt. If yes,
   set ISDlow_fault flag.
   If enabled in Op.Config. ISDlow_FET_action=1 (default = 0), turn
   OFF charge and discharge
FETs.
```

Check if ISDpass_cnt>ISD_detect_attempts. If yes, confident pass is detected and detection is suspended for the time equal to DF.ISD_detect_retry_time to save power.

In one example, a "production mode" command is used to set DF.ISD_detect_retry_time to a shorter time to have more frequent detection or to continue detection without stopping, to have more exact time stamp of the IS event. In one implementation, the logic is expressed as in the following example. Here, Ia_out is ISD current, Ia_qual is qualified bit, Isigma_tot is error margin except transient error, trans_err_p is transient error added to +margin, and trans_err_m is error subtracted from −margin. This example applies to both high and low ISD. Also, Ia_out is ISD current, Ia_qual is qualified bit, Isigma_tot is error margin except transient error, trans_err_p is transient error added to +margin, and trans_err_m is error subtracted from −margin. This example applies to both high and low ISD.

```
f_failpass(Iar_out, Iar_qual, Isigma_tot,trans_err_p,
trans_err_m,level):=
        cnt_fail←0
        cnt_pass←0
        for i∈0..rows(Iar_out)−1
            if Iar_qual_i=1
                if Iar_out_i+Isigma_tot_i+trans_err_p_i<level
                    cnt_fail←cnt_fail+1
                    cnt_pass←0
                if Iar_out_i−Isigma_tot_i−trans_err_m_i>level
                    cnt_pass←cnt_pass+1
                    cnt_fail←0
        cnt_fail_ar_i←cnt_fail
        cnt_pass_ar_i←cnt_pass
(cnt_fail_ar cnt_pass_ar)
```

Another aspect relates to high ISD level detection (see, e.g., steps 122, 124 and 134 of FIG. 1).

```
If ISD_fast_upper_margin < −DF.Max_ISC_high (default 30 mA)
    is detected, counter
ISD_high_fault is incremented by 1, ISD_high_pass_cnt = 0
    OR
If ISD_fast_upper_margin < −DF.Max_ISC_low (default 30 mA)
    is detected, counter
ISD_high_fault_cnt is incremented by 1 , ISD_high_pass_cnt = 0
    Otherwise
If ISD_smooth_lower_margin > −DF.Max_ISC_high (default 30
    mA) is detected, counter
ISD_high_pass is incremented by 1, ISD_high_fail_cnt = 0
    OR
    (if enabled)
If ISD_fast_lower_margin > −DF.Max_ISC_high (default 30 mA)
    is detected, counter
ISD_high_pass_cnt is incremented by 1, ISD_high_fail_cnt = 0
    ISC_high_alert =1 bit is set if
    ISD_high_fault_cnt>0
    Sleep mode is disabled if ISD_high_alert flag is set.
    Check if ISDhigh_fault_cnt > DF.Max ISDhigh_fault_cnt. If yes,
    set ISDhigh_fault flag.
    If enabled in Op.Config. ISDhigh_FET_action=1 (default = 0), turn
    OFF charge and discharge
FETs.
```

Check if ISD_high_pass_cnt>ISD_detect_attempts. If yes, confident pass is detected and detection is suspended for the time equal to DF.ISD_detect_retry_time to save power. Optionally, a "production mode" command is used to set DF.ISD_detect_retry_time to a shorter time to have more frequent detection or to continue detection without stopping, to have more exact time stamp of the IS event.

Another aspect relates to saving PF status "black box" values, as shown by the following example. If ISD_high or ISD_low failures were detected, the following parameters are saved into PF status: PF_ISD_high status, Is_fast value, Is_smooth value, dI_fast, dI_smooth, dI_trans, temperature update counts (time stamp counted from power up of the device), I_cc, dV/dt, PF_ISD_low status, Is_fast value, Is_smooth value, dI_fast, dI_smooth, dI_trans, temperature update counts (time stamp counted from power up of the device), I_cc, and dV/dt. This example also saves a general power factor (PF) status value as done for all PF cases (e.g voltage, current, temperature). In one example, PF_IS-D_high indicates if permanent failure is reported after customer defined number of confident high threshold faults took place (see, e.g., steps 126 and 128 of FIG. 1). This also exists for low threshold.

In certain examples, transient error direction does not depend on the sign of current. This is described, for one implementation, below.

$$\text{Trans\_err3\_}m_i := \text{if}(\text{peak\_watch}_i, |\text{trans\_err3}_i|, \text{if}(\text{trans\_err3}_i > 0, 0, |\text{trans\_err3}_i|))$$

$$\text{Trans\_err3\_}p_i := \text{if}(\text{peak\_watch}_i, |\text{trans\_err3}_i|, \text{if}(\text{trans\_err3}_i < 0, 0, |\text{trans\_err3}_i|))$$

In this example, when transient time is less then max_peak_time, transient error is added to both minus and plus margins, because direction of movement is undefined in case of peak.

An additional aspect involves disabling ISD after partial charge due to voltage hysteresis will be discussed. Particularly, relaxation takes a somewhat long amount of time (possibly 3-5 hrs) in all the tests when there is partial charge. This is due to the voltage hysteresis after charge effect, that causes OCV vs DOD dependency to be off by several % of DOD. Because of this hysteresis, DOD0 updates are disabled after partial charge below Max Disqv voltage (since it would otherwise cause an error in dod0 by several %). In case of ISD operation, this error in dod0 after partial charge results in long convergence times since DVC engine is trying to converge to new wrong DOD that corresponds to a voltage that is shifted due to hysteresis, resulting in long period of correction current. Since DOD error often is several %, it takes a long time to converge, and DOD correction current is quite high.

Figure 10:
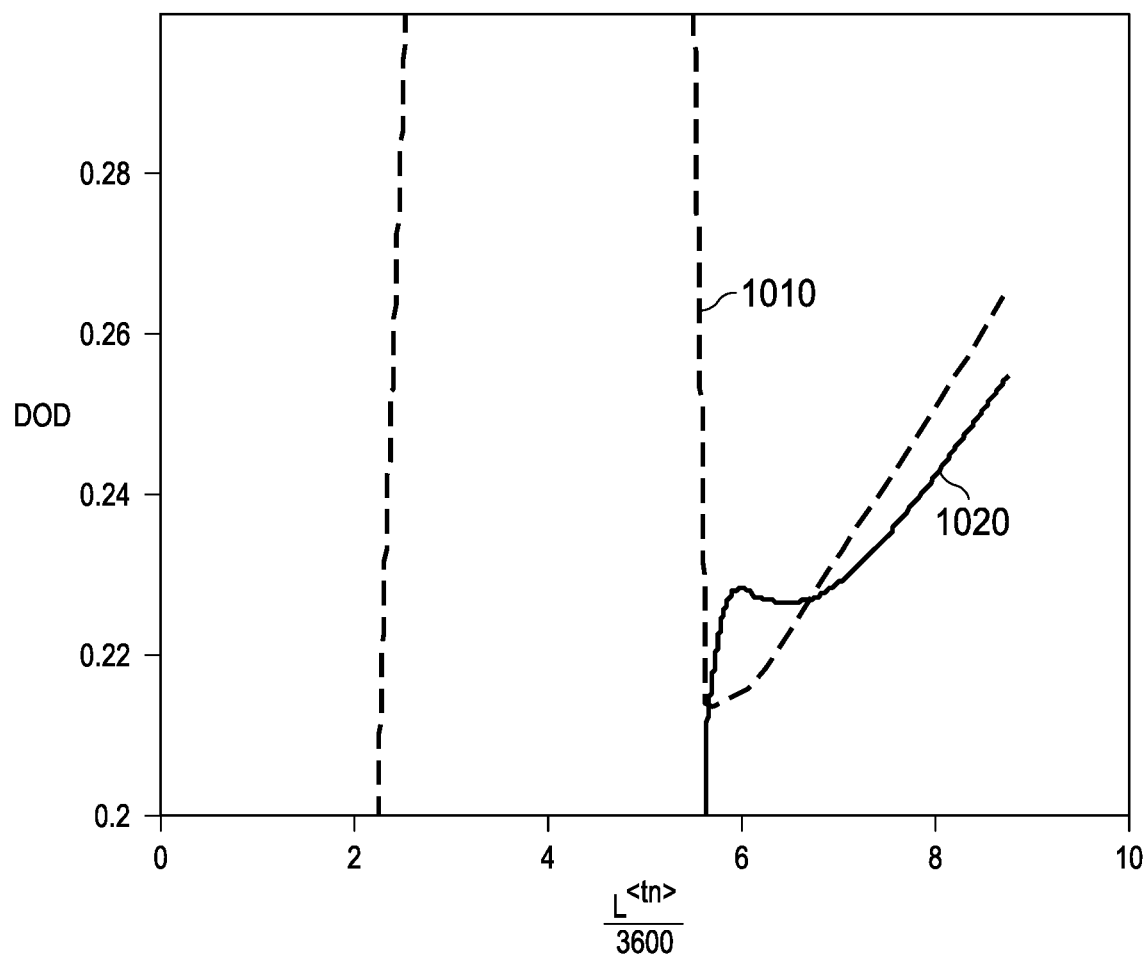
FIG. 10 shows an additional example of DOD.

In FIG. 10, graph 1000 shows an actual DOD curve 110 and a model DOD curve 1020. In this example, for ISD_Mid_Rest_Dsg_Chg_Nsleep30_ISD_Nsleep_5hr_80_113Ohm, the graph 1000 shows a comparison of the model than actual DOD, which diverge at the end because of voltage hysteresis after partial charge. A workaround for this is that for the dod0 update ISD operation is disabled after partial charge below Max Disqv Voltage. In one example, the machinery as described above is used for this DOD update. A clearing of the "partial charge" bit is added not only based on a 48 hour wait or charging above Max Disqv Voltage, but also based on partial discharge more than DF.clear_partial_dis_% (default 5%). This way, the system will be prevented from getting stuck in "partial charge" mode overall multiple cycles as was seen in some CF testing. Certain implementations are based on DOD rather than OCV since it needs to start before OCV becomes available. In one example, the "partial charge" bit is set when starting the DVC engine for a present relaxation period after charge if PresentDOD>fDOD(Max Disqv Volt). If such a bit is set, all operations proceed as normal but all ISD points are disqualified (qual bit=0 regardless of values of disqualification byte). Count for discharge starts immediately after this bit is set, and if Qdis*100/Qmax>DF.clear_partial_dis_%, "partial charge" bit clears and points become qualified.

Another aspect involves R_ISD correction during charge/discharge, and is as follows. In order to correct for ISD current during charge and discharge to assure that DOD_present will be correct at the beginning of next rest, and Qmax update will be correct, R_ISD is computed during rest, and this value is used to compute I_ISD=Vcell/R_ISD during charge/discharge. One example implementation is shown below, once the end of transient is detected, for every non-disqualified smooth ISD point:

```
1) Compute R_ISD = - V_sbs_average / I_ISD
2) U se R_ISD to update R_ISD_average
On exit from rest, start using R_ISD to compute correction current:
If R_ISD_average = 0, I_corr = 0,
Otherwise
I_corr = - V_sbs_average / R_ISD_average
```

I_corr is added to passed charge accumulation. Its sign is negative (discharge) so the sign has to be handled according to what sign is used for passed Q accumulation. In one implementation, R_ISD_average is reported as a separate value. If not updated (for example if rest was not long enough to detect end of transient), it stays unchanged from previous rest period. R_ISD_average resets to first measured value at the point when transient end bit is set, to enable quick reaction time to possible onset of a short that could be a cause of the present transient.

An additional aspect relates to temperature compensation of max_transient_time and max_peak_time. Because relaxation takes longer time at low temperature, maximal expected relaxation times used in end of transient detection and transient error estimation algorithm should be temperature compensated to prevent out of margin errors at low temperature. One implementation includes computing a compensation factor Tcomp for every smooth ISD sample as follows:

```
Tcomp= Rbexp(dod,T):=e^{if[T>250,frb_h(dod)*(T-250),frb_l(dod)*(T-250)]}
    (use already existing function)
    Here, dod is present dod_dvc, temperature is present temperature in
    C*10 units.
    Compute corrected max_transient_time = DF.max_transient_time
    * Tcomp
    Compute corrected max_peak_time = DF.max_peak_time *
    Tcomp
    Use computed values in all subsequent calculations for present
    smooth ISD sample.
```

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. A process of determining an internal short condition in a battery, comprising:
    storing steady state characteristics of the battery and transient characteristics of the battery in a memory;
    operating the battery;
    measuring an absolute value of a system current I system of the battery;
    determining that the absolute value of a system current I system is less than a threshold value IQUIT for longer than a predetermined charging or discharging relax time;
    measuring the battery voltage, the battery current, and the battery temperature;
    computing an estimated current value based on the measured battery voltage, the measured battery current, the measured battery temperature, and the model of the battery that includes steady state characteristics of the battery and transient characteristics of the battery;
    computing an internal short current value according to the measured battery current, and the estimated current value; and
    determining if a battery short condition exists according to the internal short current value.

2. The process of claim 1 including:
    computing a depth of discharge (DOD) of the battery according to the measured battery voltage, the measured battery current, the measured battery temperature, and the model.

3. The process of claim 1 including:
    computing the estimated current value for different sample times;
    computing the internal short current value for the sample times;
    computing a first linear regression according to a first integer number J of the internal short current values to determine a first regression average value and a first regression deviation value, J being greater than 1;
    computing a second linear regression according to a second integer number K of the internal short current values to determine a second regression average value and a second regression deviation value, K being greater than J; and
    computing a first upper error margin value and a first lower error margin value according to the first regression deviation value;
    computing a second upper error margin value and a second lower error margin value according to the second regression deviation value;
    determining a short condition status value according to the first upper error margin value, the first lower error margin value, the second upper error margin value and the second lower error margin value.

4. The process of claim 3 including:
    computing the first upper error margin value and the second upper error margin value according to a variance error, and a gain error;
    computing the first lower error margin value and the second lower error margin value according to the variance error, and the gain error.

5. The process of claim 4 including:
    computing the first upper error margin value and the second upper error margin value according to an offset error; and
    computing the first lower error margin value and the second lower error margin value according to the offset error.

6. The process of claim 5 including:
    computing the first upper error margin value and the second upper error margin value according to a first transient error; and
    computing the first lower error margin value and the second lower error margin value according to a second transient error.

7. The process of claim 3 including:
    in response to either the first upper error margin value or the second upper error margin value being less than a first threshold, incrementing a low fault counter; and
    in response to the low fault counter being greater than a first predetermined number, setting the short condition status value to a first value which indicates that no battery short condition exists.

8. The process of claim 7 including:
in response to either the second lower error margin value or the first lower error margin value being greater than the first threshold, setting the low fault counter equal to zero.

9. The process of claim 3 including:
in response to either the first upper error margin value being less than a second threshold or the first upper error margin value being less than the first threshold, incrementing a high fault counter; and
in response to the high fault counter being greater than a second predetermined number, setting the short condition status value to a second value which indicates that a battery short condition exists.

10. The process of claim 9 including:
in response to the either the second lower error margin value or the first lower error margin value being lower than the second threshold, setting the high fault counter equal to zero.

11. The process of claim 1 including:
in response to determining that the battery short condition exists, disconnecting the battery with a battery disconnect switch.

12. The process of claim 1 including:
in response to determining that the battery short condition exists, generating a message indicating that the battery short condition exists, and delivering the message that the battery short condition exists to a host.

13. An integrated circuit for determining an internal short condition in a battery, comprising:
a memory configured to store a model of the battery that includes steady state characteristics of the battery and transient characteristics of the battery;
battery voltage determination circuitry having an input adapted to be coupled to the battery and having a voltage output;
battery current determination circuitry having an input adapted to be coupled to the battery and having a current output; and
a controller including a first input coupled to the voltage output, a second input coupled to the current output, and a third input adapted to receive a measure battery temperature, the controller including circuitry to:
measure an absolute value of a system current I system of the battery;
determine that the absolute value of a system current I system is less than a threshold value IQUIT for longer than a predetermined charging or discharging relax time;
measure the battery voltage, the battery current, and the battery temperature;
compute an estimated current value based on a measured battery voltage, a measured battery current, a measured battery temperature, and the model of the battery that includes the steady state characteristics of the battery and the transient characteristics of the battery;
compute an internal short current value according to the measured battery current, and the estimated current value; and
determine if a battery short condition exists according to the internal short current value.

14. The IC of claim 13, in which the processor is configured to:
compute the estimated current value for different sample times;
compute the internal short current value for the sample times;
compute a first linear regression according to a first integer number J of the internal short current values to determine a first regression average value and a first regression deviation value, J being greater than 1;
compute a second linear regression according to a second integer number K of the internal short current values to determine a second regression average value and a second regression deviation value, K being greater than J; and
compute a first upper error margin value and a first lower error margin value according to the first regression deviation value;
compute a second upper error margin value and a second lower error margin value according to the second regression deviation value;
determine a short condition status value according to the first upper error margin value, the first lower error margin value, the second upper error margin value and the second lower error margin value.

15. The IC of claim 14, in which the processor is configured to:
compute the first upper error margin value and the second upper error margin value according to a first transient error; and
compute the first lower error margin value and the second lower error margin value according to a second transient error.

16. The IC of claim 14, in which the processor is configured to:
in response to either the first upper error margin value or the second upper error margin value being less than a first threshold, increment a low fault counter; and
in response to the low fault counter being greater than a first predetermined number, set the short condition status value to a first value which indicates that no battery short condition exists.

17. The IC of claim 16, in which the processor is configured to:
in response to either the second lower error margin value or the first lower error margin value being greater than the first threshold, set the low fault counter equal to zero.

18. The IC of claim 14, in which the processor is configured to:
in response to either the first upper error margin value being less than a second threshold or the first upper error margin value being less than the first threshold, increment a high fault counter; and
in response to the high fault counter being greater than a second predetermined number, set the short condition status value to a second value which indicates that a battery short condition exists.

19. The IC of claim 18, in which the processor is configured to:
in response to the either the second lower error margin value or the first lower error margin value being lower than the second threshold, set the high fault counter equal to zero.

20. The IC of claim 13, in which the processor is configured to:
in response to determining that the battery short condition exists, with a battery disconnect switch, disconnect the battery.

21. The IC of claim 13, in which the processor is configured to:
in response to determining that the battery short condition exists, generating a message indicating that the battery short condition exists, and delivering the message that the battery short condition exists to a host.

22. A non-transitory computer readable medium including computer readable instructions, which when executed by a processor, cause the processor to:

measure an absolute value of a system current I system of a battery;

determine that the absolute value of a system current I system is less than a threshold value IQUIT for longer than a predetermined charging or discharging relax time;

measure the battery voltage, the battery current, and the battery temperature;

compute an estimated current value based on a measured battery voltage, a measured battery current, a measured battery temperature, and a model of the battery that includes steady state characteristics of the battery and transient characteristics of the battery;

compute an internal short current value according to the measured battery current, and the estimated current value; and determine if a battery short condition exists according to the internal short current value.

\* \* \* \* \*